US012577662B2

(12) United States Patent
Hirai et al.

(10) Patent No.: US 12,577,662 B2
(45) Date of Patent: Mar. 17, 2026

(54) TIN-CONTAINING PRECURSORS FOR DEPOSITION OF TIN-CONTAINING THIN FILMS AND THEIR CORRESPONDING DEPOSITION PROCESSES

(71) Applicant: L'Air Liquide, Société Anonyme pour l'Etude et l'Exploitation des Procédés Georges Claude, Paris (FR)

(72) Inventors: Masato Hirai, Yokosuka (JP); Sunao Kamimura, Yokosuka (JP); Ling Yun Jia, Tsukuba (JP); Christian Dussarrat, Tokyo (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 18/723,748

(22) PCT Filed: Dec. 29, 2021

(86) PCT No.: PCT/US2021/065427
§ 371 (c)(1),
(2) Date: Jun. 24, 2024

(87) PCT Pub. No.: WO2023/129144
PCT Pub. Date: Jul. 6, 2023

(65) Prior Publication Data
US 2025/0059643 A1 Feb. 20, 2025

(51) Int. Cl.
*C23C 16/40* (2006.01)
*C23C 16/44* (2006.01)
*C23C 16/455* (2006.01)

(52) U.S. Cl.
CPC ...... *C23C 16/407* (2013.01); *C23C 16/45553* (2013.01); *C23C 16/4417* (2013.01)

(58) Field of Classification Search
CPC ............ C23C 16/407; C23C 16/45553; C23C 16/4417; C23C 16/52; C01P 2002/85; C01G 19/02
See application file for complete search history.

(56) References Cited

U.S. PATENT DOCUMENTS 4,146,657 A * 3/1979 Gordon .................... H05B 3/84 427/255.35
5,576,460 A 11/1996 Buchwald et al.
(Continued)

FOREIGN PATENT DOCUMENTS

| | | |
|---|---|---|
| CN | 104518157 | 4/2015 |
| GB | 1 043 609 | 9/1966 |
| WO | WO 2020 036899 | 2/2020 |

OTHER PUBLICATIONS

Izvestiya (Izvestiya Akademii Nauk SSSR-Seria Khimicheskaya, 1982, vol. 6, pp. 1294-1298) (Year: 1982).*
(Continued)

*Primary Examiner* — Michael G Miller
(74) *Attorney, Agent, or Firm* — Yan Jiang

(57) ABSTRACT

A method for forming a tin-containing film on a substrate comprises: exposing the substrate to a vapor or a liquid of a film-forming composition that comprises a tin-containing precursor having the general formula: $(R_3Sn)_2NR'$, wherein R and R' each are independently H, a $C_1$ to $C_6$ linear, branched or cyclic alkyl group, or a $C_1$ to $C_4$ linear, branched or cyclic saturated hydrofluorocarbon group, and depositing at least part of the tin-containing precursor onto the substrate to form the tin-containing film using a deposition method. The exemplary tin-containing precursors include $(Me_3Sn)_2NMe$, $(Me_3Sn)_2NEt$, $(Me_3Sn)_2N(nPr)$, $(Me_3Sn)_2N(nBu)$ and $(Me_3Sn)_2N(CH_2CF_3)$.

18 Claims, 2 Drawing Sheets

(56) References Cited

U.S. PATENT DOCUMENTS

| | | | |
|---|---|---|---|
| 8,334,016 | B2 | 12/2012 | Gordon et al. |
| 2018/0334471 | A1 | 11/2018 | Park et al. |
| 2019/0144472 | A1 | 5/2019 | Ryu et al. |
| 2019/0390341 | A1 | 12/2019 | Singhal et al. |
| 2020/0002814 | A1 | 1/2020 | Knisley et al. |
| 2020/0223877 | A1 | 7/2020 | Odedra et al. |
| 2020/0231610 | A1 | 7/2020 | Ryu et al. |

OTHER PUBLICATIONS

Eichler ("The design and synthesis of heterometallic alkoxide-amides and their application in the MOCVD of zirconium-tin-titanate (ZTT)", Eichler et al., J. Mater. Chem 2004, 14, 3139-3143) (Year: 2004).*

Choi, D.-W. et al., Highly conductive $SnO_2$ thin films deposited by atomic layer deposition using tetrakis-dimethyl-amine-tin precursor and ozone reactant, Surface & Coatings Technology 259 (2014) 238-243.

Choi, W.-S., Effects of seed layer and thermal treatment on atomic layer deposition-grown tin oxide, The Korean Institute of Electrical and Electronic Material Engineers (KIEEME), 11(5), 222-225.

Choi, W.-S., The fabrication of tin oxide films by atomic layer deposition using tetrakis(ethylmethylamino) tin precursor, The Korean Institute of Electrical and Electronic Material Engineers (KIEEME), 10(6), 200-202.

Das, S., et al. SnO 2: a comprehensive review on structures and gas sensors, Progress in Materials Science 66 (2014) 112-255 and Corrigendum to $SnO_2$: a comprehensive review on structures and gas sensors, Progress in Materials Science 67 (2015) 161.

Diemer, S. et al., Synthese und Struktur von Bis(trimethylstannyl)- und Bis(dimethylhalogenstannyl)aminen zur Rolle des Stickstoff-Elektronenpaares, Chem Ber. 1992, 125, 389-400, with English abstract.

Eichler, J.F. et al., The design and synthesis of heterometallic alkoxide-amides and their application in the MOCVD of zirconium-tin-titanate (ZTT), J. Mater. Chem. 2004, 14, 3139-3143.

Elam, J.W. et al., Atomic layer deposition of indium tin oxide thin films using nonhalogenated precursors, J. Phys. Chem. C 2008, 112, 1938-1945.

Elam, J.W. et al., Atomic layer deposition of tin oxide films using tetrakis(dimehylamino) tin, J. Vac. Sci. Technol. A 26(2), Mar./Apr. 2008, 244-252.

Izvestiyai Akademii Nauk SSSR-Seria Khimicheskaya 1982 vol. 6 1294-1298.

Jones, K. et al., Amino-derivatives of metals and metalloids. Part I. Preparation of aminostannanes, stannylamines, and stannazanes, J. Chem. Soc. 1965, 1944-1951.

Mullings, M.N. et al., Tin oxide atomic layer deposition from tetrakis(dimethylamino)tin and water, J. Vac. Sci. Technol. A 31(6), Nov./Dec. 2013, 061503.

Neumann, C. et al., New building blocks in amide chemistry—N-lithiobis(trimethylstannyl)amine and N-lithiotrimethylstannyl(trimethylsilyl)amine, Angew. Chem. Int. d. 2001, 40, No. 18, 3405-3407.

Prasittichai, C. et al., Surface modification of $SnO_2$ photoelectrodes in dye-sensitized solar cells significant improvements in photovoltage via $Al_2O_3$ atomic layer deposition, J. Phys. Chem. Lett. 2010, 1, 1611-1615.

Sisedo, K. et al., Formation of an organotin-nitrogen bond. II. Syntheses of tris(trialkyltin)amines, J. Org. Soc. 1964, 29, 907-909.

International Search Report and Written Opinion for corresponding PCT/US2021/065427, Mar. 29, 2022.

* cited by examiner

TIN-CONTAINING PRECURSORS FOR DEPOSITION OF TIN-CONTAINING THIN FILMS AND THEIR CORRESPONDING DEPOSITION PROCESSES

CROSS REFERENCE TO RELATED APPLICATIONS

This application is a 371 of International Application No. PCT/US2021/065427, filed Dec. 29, 2021, the entire contents of which are incorporated herein by reference.

TECHNICAL FIELD

The present invention relates to film-forming compositions comprising tin-containing precursors and method of using the same to deposit tin-containing films by chemical vapor deposition (CVD) or atomic layer deposition (ALD), and, in particular, to the film-forming compositions comprising the tin-containing precursor having the general formula:

$(R_3Sn)_2NR'$, wherein R and R' each are independently H, a $C_1$ to $C_6$ linear, branched or cyclic alkyl group, or a $C_1$ to $C_4$ linear, branched or cyclic saturated hydrofluorocarbon group.

BACKGROUND

Transparent conducting oxides (TCOs) have been extensively studied in both academia and industry for a number of front running technologies including liquid crystal displays, organic light-emitting diodes (OLEDs), touchscreens and photovoltaics. Among all TCOs, indium oxides including indium tin oxide (ITO), indium zinc oxide (IZO) and $InO_x$ have been established as crucial components of the aforementioned applications, owing to their remarkable transmissive and electrical properties. For instance, ITO, which is mostly utilized in the form of oxygen-saturated composition with a formulation of 74% In, 18% $O_2$, and 8% Sn, has been readily utilized as components of liquid crystal displays, OLED displays, touch panels as well as photovoltaics. In fact, the global market revenue for ITO has surpassed $1.5B USD and is expected to continue growing for at least until 2025. Despite the rising demand, however, rarity and expensiveness of indium have been the bottleneck of cost reduction of indium-containing materials. There have thus been intense development efforts to explore alternative TCOs that are composed of abundant resources and require less indium usage especially tin-based materials such as SnO, $SnO_2$, Zinc Tin Oxide (ZTO) and fluorine-doped tin oxide (FTO). Indeed, $SnO_2$, for example, is a chemically and thermally stable, transparent n-type semiconducting oxide with a high direct and indirect optical band gap of ~3.6 eV and ~2.6 eV, respectively. Its good quality of electrical, optical, and electrochemical properties are exploited in thin film solar cells, as catalytic support materials, as solid-state chemical sensors and as high-capacity lithium-storage. Another material that has gathered a great deal of attention is ZTO as its thin films show a wide band gap (~3.6 eV) and are n-type semiconductors with dominant crystal structures of $ZnSnO_3$ and $Zn_2SnO_4$ which consist of a low electrical resistivity of ~$4\times10^{-3}$ and ~$10^{-3}$ Ωcm, respectively, as well as high electron mobility of ~10-15 $cm^2V^{-1}s^{-1}$. Owing to such impressive properties, ZTO has been regarded as a cheaper alternative to ITO, and has been intensively studied as components for large area flexible OLEDs, an active material in gas sensors, a buffer layer in solar cells as well as passivation layers in indium-gallium-zinc-oxide (IGZO) thin film transistors (TFTs). Nonetheless, the electrical properties of ZTO are not comparable with the leading TCO materials such as ITO, mainly due to the difficulty in producing single crystalline oxides and localized disorder of tin in the polycrystalline ZTO.

GB1043609 to Oakes discloses dialkyl tin salts of organic acids are prepared by grinding together a dialkyl tin oxide and an acid anhydride.

U.S. Pat. No. 8,334,016 to Gordon et al. discloses metal silicates or phosphates are deposited on a heated substrate by the reaction of vapors of alkoxysilanols or alkylphosphates along with reactive metal amides, alkyls or alkoxides.

US 2018/0334471 to Park et al. disclose a metal precursor having improved thermal stability and volatility and using the metal precursor to manufacture a metal oxide thin film.

US 2019/144472 to Ryu et al. disclose a tin compound, tin precursor compound for ALD, a method of forming a tin-containing material film, and a method of synthesizing a tin compound, the tin compound being represented by Chemical Formula (I):

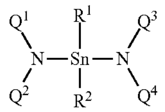

wherein $R^1$, $R^2$, $Q^1$, $Q^2$, $Q^3$, and $Q^4$ are each independently a C1 to C4 linear or branched alkyl group.

US 2020/0231610 to Ryu et al. disclose a tin compound, a tin precursor compound for forming a tin-containing layer, and a method of forming a thin layer, the tin compound being represented by Formula 1:

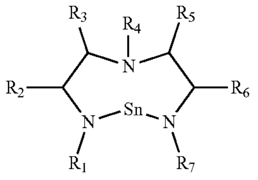

wherein $R^1$, $R^2$, $R^3$, $R^4$, $R^5$, $R^6$, and $R^7$ are each independently hydrogen, a linear alkyl group having 1 to 4 carbon atoms, or a branched alkyl group having 3 or 4 carbon atoms.

US 2019/0390341 to Singhal, et al disclose an ALD configured to deposit a metal oxide layer onto an organic photoresist on a substrate using organic metal precursors that are metal organic tin precursors, such as an amino 10 type precursor or a methoxy type precursor. Examples of amino 10 precursors include Dimethylaminodimethyltin ($Me_2Sn(NMe_2)_2$), Dimethylaminotrimethyltin ($Me_3Sn(MMe_2)$), Tetra kis dimethylamino tin ($Sn(NMe_2)_4$) or Tetrakisdiethylamino tin ($Sn(NEt_2)_4$). An example of a methoxy type precursor includes Dibutyl dimethoxy tin ($Bu_2Sn(OMe)_2$) or (b) amino tin and methoxy metal organic tin precursors.

US 2020/0223877 to Odedra et al. disclose compounds useful for the deposition of high purity tin oxide. Such compounds have the formula: $Rx\text{-}Sn\text{-}A_{4-x}$, wherein: A is selected from the group consisting of $(Y_aR'_z)$ and a 3- to 7-membered N-containing heterocyclic group; each R group is independently selected from the group consisting of an alkyl or aryl group having from 1 to 10 carbon atoms; each R' group is independently selected from the group consisting of an alkyl, acyl or aryl group having from 1 to 10 carbon atoms; x is an integer from 0 to 4; a is an integer from 0 to 1; Y is selected from the group consisting of N, O, S, and P; and z is 1 when Y is O, S or when Y is absent and z is 2 when Y is N or P.

US 2020/0002814 to Knisley et al, disclose tin containing precursors and methods of forming tin-containing thin films. The tin precursor has a tin-diazadiene bond and is homoleptic or heteroleptic.

Kozima et al. disclose ("Formation of an Organotin-Nitrogen Bond. 11.1 Syntheses of Tris(trialkyltin)amines", J. Org. Soc. 1964, 29, 907) preparation of Tris(trialkyltin) amines $(R_3Sn)_3N$ by the reaction of lithium amide or sodium amide with trialkyltin halide.

Jones et al. disclose ("Amino-derivatives of Metals and Metalloids. Part I. Preparation of Aminostannanes, Stannylamines, and Stannazanes", J. Chem. Soc. 1965, 1944-1951) preparation of amino-derivatives of tin(IV) including aminostannanes $R_nSn(NR'_2)_{4-n}$, stannylamines $R_3Sn{\cdot}NHR$ and $(R_2Sn)_3N$, distannazanes $(R_3Sn)_2NR'$, and cyclictristannazanes $(R_2SnR)_3$.

Diemer et al. disclose ("Synthese und Struktur von Bis (trimethylstanny1)- und Bis(dimethylhalogenstanny1)aminen: zur Rolle des Stickstoff-Elektronenpaares", Chem. Ber. 1992, 125, 389).

Neumann et al. disclose ("New Building Blocks in Amide Chemistry—N-Lithiobis(trimethylstannyl)amine and N-Lithiotrimethylstannyl(trimethylsilyl)amine", Angew. Chem. Int. Ed. 2001, 40, 3405).

Elam et al. disclose ("Atomic Layer Deposition of Indium Tin Oxide Thin Films Using Nonhalogenated Precursors", J. Phys. Chem. C 2008, 112, 1938).

Elam et al. disclose ("Atomic layer deposition of tin oxide films using tetrakis(dimethylamino) tin", J. Vac. Sci. Technol. 2008, 26, 244).

Choi discloses ("The Fabrication of Tin Oxide Films by Atomic Layer Deposition using Tetrakis(Ethylmethylamino) Tin Precursor", Trans. Electr. Electron. Mater. 2009, 10, 200).

Choi discloses ("Effects of Seed Layer and Thermal Treatment on Atomic Layer Deposition-Grown Tin Oxide", Trans. Electr. Electron. Mater. 2010, 11, 222).

Prasittichai et al. disclose ("Surface Modification of $SnO_2$ Photoelectrodes in Dye-Sensitized Solar Cells: Significant Improvements in Photovoltage via $Al_2O_3$ Atomic Layer Deposition", J. Phys. Chem. Lett. 2010, 1, 1611).

Mullings et al. disclose ("Tin oxide atomic layer deposition from tetrakis(dimethylamino)tin and water", J. Vac. Sci. Technol. A 2013, 31, 061503).

Choi et al. disclose ("Highly conductive $SnO_2$ thin films deposited by atomic layer deposition using tetrakis-dimethyl-amine-tin precursor and ozone reactant", Surf. Coat. Technol. 2014, 259, 238).

Das et al. disclose ("$SnO_2$: A comprehensive review on structures and gas sensors", Ceram. Int. 2019, 45, 5124).

It is important to emphasize that the tin-containing materials listed above are commonly utilized in the form of thin films especially for display and coating applications. It is therefore desirable to establish techniques to minimize the deposition temperature of tin-containing thin films with sufficient conformality as well as crystallinity.

Strategies to incorporate tin into thin film materials have rapidly advanced over the past several decades, notably by dry physical methods such as chemical vapor deposition (CVD) and atomic layer deposition (ALD). In fact, numerous tin precursors have been developed up to date, many of which consist of Sn centers with an oxidation state of +IV. In particular, tetrakis(dimethylamino)tin (TDMASn, $((CH_3)_2\ N)_4Sn$, CAS #1066-77-9) has been extensively studied both in academia and industry as it is one of the very few liquid precursors that can generate thin films of $SnO_x$ at temperatures below 100° C. upon reaction with $H_2O$, $O_3$ or $H_2O_2$ with or without assistance of plasma. Processes at low temperature are particularly attractive for applications, for example, in display and coating of transparent devices since too high of a process temperature can cause destruction of the architecture lying underneath. Despite its superb peculiarity, TMDASn also has several notable drawbacks. For instance, TDMASn costs four molecules of dimethylamino lithium ($Me_2NLi$), a pyrophoric organometallic reagent typically prepared by the reaction of dimethylamine and n-butyllithium, to synthesize one molecule, which consequently makes it inconvenient for large-scale production. In addition, the volatility of TDMASn is rather low (0.1 Torr at 50° C.) which results in limitation of its use especially in large-scale delivery. The limited volatility of TDMASn could be explained by its size as well as its high symmetry (point group=$T_d$). An attempt to improve the volatility of tetrakis amido tin derivatives was made previously by desymmetrization by incorporating asymmetrical amido ligands, namely, ethylmethylamido group, but the volatility deteriorated (0.4 torr at 100° C.) instead, possibly because the overall symmetry was still sufficiently high (point group=$D_{3d}$). Desymmetrization can also be achieved by preparing tetrakis amido tin complexes bearing two or more types of amido ligands but no simple procedure to synthesize such tin compounds has been developed so far. It is also noteworthy that $Me_2NH$ is a gas that requires special handling.

There are several other tin precursors that are compatible with low temperature deposition processes but predominantly those with tin centers of oxidation state of +II. For example, bis(hexamethyldisilylamino)tin ($Sn(hmds)_2$), one of the rare stable diaminostannylenes, was found to afford tin oxide thin films at temperatures as low as 80° C. and 100° C. using $O_3$ and $H_2O$, respectively, as reactant gases. While tin oxide thin films made by using $H_2O$ as reactant gas were typically mixtures of SnO and $SnO_2$, those generated by using $O_3$ suffered from Si contamination arising from the degradation of hexamethyldisilazane (HMDS). In addition, $Sn(hmds)_2$ has a low melting point of 37° C. but has a low volatility recording only 0.05 torr at 112° C. In the case of bis(N-ethoxy-2,2-dimethyl propanamido)tin ($Sn(edpa)_2$), a liquid Sn(II) precursor without silicon in its ligands, treatment with $H_2O$ at temperatures between 70 to 180° C. resulted in formation of thin films of amorphous SnO without noticeable carbon and nitrogen contaminants. The aforementioned process is one of the rare examples enabling the production of SnO with marginal presence of Sn(IV) impurity. Alternatively, pure polycrystalline $SnO_2$ thin films can be generated by using $O_2$ plasma as a coreactant under the same temperature range. Nevertheless, the volatility of $Sn(edpa)_2$ is still insufficient (0.1 torr at 90° C.) and further improvement is necessary.

Overall, there is still a need to develop new liquid Sn ALD precursors that are both sufficiently reactive and volatile at low temperatures.

SUMMARY

Disclosed is a method for forming a tin-containing film on a substrate, the method comprising:

exposing the substrate to a vapor or a liquid of a film-forming composition that comprises a tin-containing precursor having the general formula:

$(R_3Sn)_2NR'$ wherein R and R' each are independently H, a $C_1$ to $C_6$ linear, branched or cyclic alkyl group, or a $C_1$ to $C_4$ linear, branched or cyclic saturated hydrofluorocarbon group; and depositing at least part of the tin-containing precursor onto the substrate to form the tin-containing film using a chemical deposition method. The disclosed method may include one or more of the following features:

the chemical deposition method including ALD, CVD, MLD, SOD, SOC, mist coating, dip coating, slit coating, spray coating;
the chemical deposition method being ALD;
the chemical deposition method being CVD;
the chemical deposition method being MLD;
the chemical deposition method being SOD;
the chemical deposition method being SOC;
the chemical deposition method being mist coating;
the chemical deposition method being dip coating;
the chemical deposition method being slit coating;
the chemical deposition method being spray coating;
the deposition method may be assisted by heating, light, direct or remote plasma, or combination thereof;
the deposition method may not be assisted by heating, light, direct or remote plasma, or combination thereof;
a deposition temperature for the chemical deposition method being approximately 100° C. or lower;
a deposition temperature for the chemical deposition method being approximately 80° C. or lower;
the tin-containing precursors being liquid at ambient temperature;
the tin-containing precursors being volatile at a temperature of approximately 100° C. or lower;
the tin-containing precursors being volatile at a temperature of approximately 80° C. or lower;
the tin-containing precursor being $(Me_3Sn)_2NMe$;
the tin-containing precursor being $(Me_3Sn)_2NEt$;
the tin-containing precursor being $(Me_3Sn)_2N(nPr)$;
the tin-containing precursor being $(Me_3Sn)_2N(nBu)$;
the tin-containing precursor being $(Me_3Sn)_2N(CH_2CF_3)$;
further comprising exposing the substrate to a co-reactant;
the co-reactant being an oxidizing agent selected from $O_2$, $O_3$, $H_2O$, $H_2O_2$, NO, $N_2O$, $NO_2$, O radicals, alcohol, silanols, aminoalcohols, carboxylic acids, para-formaldehyde, or mixtures thereof;
the co-reactant being $O_3$;
the co-reactant being $O_2$;
the co-reactant being $H_2O_2$;
the co-reactant being $H_2O$;
the oxidizing agent being $O_3$;
the oxidizing agent being $O_2$;
the oxidizing agent being $H_2O_2$;
the oxidizing agent being $H_2O$;
the co-reactant being a nitrogen-containing reducing agent selected from $NH_3$, $N_2$, $H_2$, $N_2/H_2$, $H_2$ and $NH_3$, $N_2$ and $NH_3$, $NH_3$ and $N_2H_4$, NO, $N_2O$, amines, diamines, cyanides, di-imines, hydrazines, organic amines, pyrazoline, pyridine, primary amines such as methylamine, ethylamine, tertbutylamine, secondary amines such as dimethylamine, diethylamine, di-isopropylamine, ethylmethylamine, pyrrolidine, tertiary amines such as trimethylamine, triethylamine, trisilylamine, or mixture thereof;
the nitrogen-containing reducing agent being $NH_3$;
the tin-containing film being $SnO_2$, InSnO (ITO), ZnSnO (ZTO), SnN, SnP, SnAs, SnSb or $Sn_2S_3$;
the tin-containing film being $SnO_2$;
the tin-containing film being InSnO (ITO);
the tin-containing film being ZnSnO (ZTO);
the tin-containing film being SnN;
the tin-containing film being SnP;
the tin-containing film being SnAs;
the tin-containing film being SnSb;
the tin-containing film being $Sn_2S_3$;
the tin-containing film containing a second element selected from Zn, In, Ga, N, S, P, As, Sb, B, Ta, Hf, Nb, Mg, Al, Sr, Y, Ba, Ca, Bi, Pb, Co, one or more lanthanides, or mixtures thereof;
the substrate being a powder; and
the powder comprising one or more of NMC (Lithium Nickel Manganese Cobalt Oxide), LCO (Lithium Cobalt Oxide), LFP (Lithium Iron Phosphate), and other battery cathode materials.

Also disclosed is a film-forming composition for a vapor deposition process comprising a tin-containing precursor having the general formula:

$(R_3Sn)_2NR'$ wherein R and R' each are independently H, a $C_1$ to $C_6$ linear, branched or cyclic alkyl group, or a $C_1$ to $C_4$ linear, branched or cyclic saturated hydrofluorocarbon group. The disclosed composition may include one or more of the following features:

the tin-containing precursor being selected from the group consisting of $(Me_3Sn)_2NMe$, $(Me_3Sn)_2NEt$, $(Me_3Sn)_2N(nPr)$, $(Me_3Sn)_2N(nBu)$ and $(Me_3Sn)_2N(CH_2CF_3)$;
a purity of the tin-containing precursor being great than 99%;
the tin-containing precursor being liquid at ambient temperature; and
the tin-containing precursor being volatile at a temperature of approximately 100° C. or lower.

Notation and Nomenclature

The following detailed description and claims utilize a number of abbreviations, symbols, and terms, which are generally well known in the art. Certain abbreviations, symbols, and terms are used throughout the following description and claims, and include:

As used herein, the indefinite article “a” or “an” means one or more.

As used herein, “about” or “around” or “approximately” in the text or in a claim means ±10% of the value stated.

As used herein, “room temperature” in the text or in a claim means from approximately 20° C. to approximately 25° C.

The term “ambient temperature” refers to an environment temperature approximately 20° C. to approximately 25° C.

The term “substrate” refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of films on a substrate and at least the top-most film having topographic features that have been created in steps prior to the deposition of the indium containing film.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole" and "trench" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "deposition temperature" and "substrate temperature" may be used interchangeably. It is understood that a substrate temperature may correspond to, or be related to a deposition temperature, and that the deposition temperature may refer to the substrate temperature.

The term "film-forming composition" refers to a composition used for deposition of a film. The film-forming composition may include, but is not limited to, a precursor, a solvent and/or a carrier gas. Furthermore, the film-forming composition may include, but is not limited to, a precursor, optionally a solvent, optionally a carrier gas, and optionally one or more co-reactant(s). Herein, the precursor may be supplied either in a neat form or in a blend with a suitable solvent. The precursor may be present in varying concentrations in the solvent. Alternatively, the precursor may be vaporized by passing a carrier gas into a container that contains the precursor or by bubbling the carrier gas into the precursor. The carrier gas and precursor are then introduced into a reactor as a vapor. The co-reactant may be an oxidizer, a reducing agent, a dilute gas, an additive, an additional or secondary precursor, etc., for assisting in formation of the film. Here an inert gas selected from $N_2$, Ar, Kr, Xe may be used as the carrier gas and/or the dilute gas.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichoimetry. The silicon-containing films may include pure silicon (Si) layers, such as crystalline Si, polysilicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants from group III, IV, V and VI, such as B, C, P, As and/or Ge.

Please note that the films or layers deposited, such as silicon oxide or silicon nitride, may be listed throughout the specification and claims without reference to their proper stoichiometry (i.e., SiO, $SiO_2$, $Si_3N_4$). The layers may include pure (Si) layers, carbide ($Si_oC_p$) layers, nitride ($Si_kN_l$) layers, oxide ($Si_nO_m$) layers, or mixtures thereof, wherein k, l, m, n, o, and p inclusively range from 1 to 6. For instance, silicon oxide is $Si_nO_m$, wherein n ranges from 0.5 to 1.5 and m ranges from 1.5 to 3.5. More preferably, the silicon oxide layer is SiO or $SiO_2$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.).

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
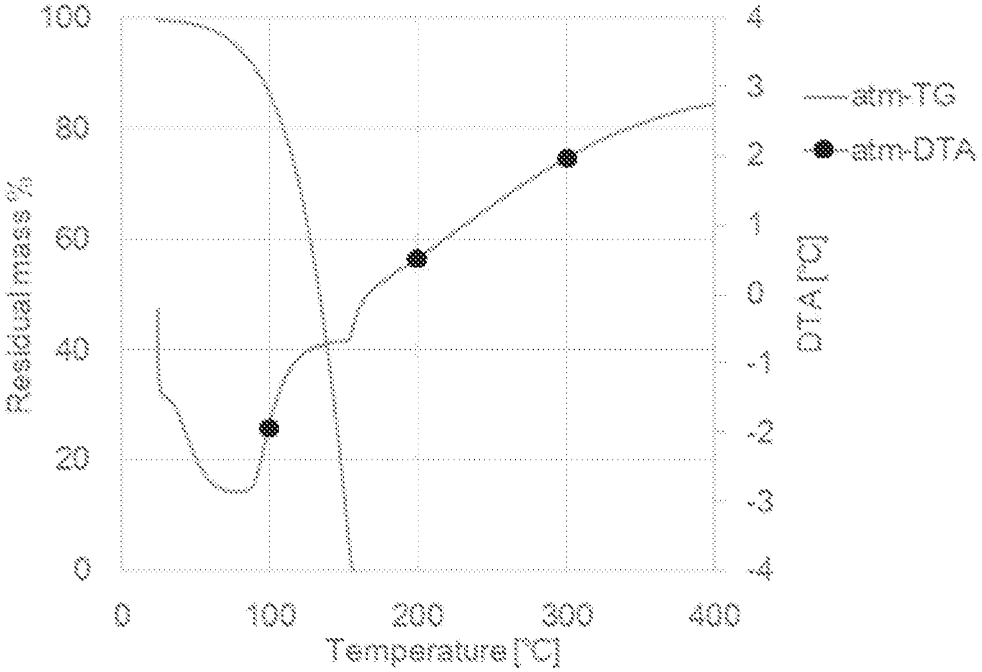
FIG. 1 shows TG and DTA profiles of $(Me_3Sn)_2NEt$.

Disclosed are film-forming compositions comprising a tin-containing precursor and method of using the same to deposit tin-containing films applied in electronics, displays and coatings by chemical vapor deposition (CVD) or atomic layer deposition (ALD). The tin-containing films may be a tin oxide film $SnO_x$ where x is varies between 1 and 2 inclusively, an indium tin oxide $In_{2-y}Sn_yO_3$ (ITO) where indium and tin are in various concentrations and y varies between 0 and 1, preferably between 0 and 0.2, a zinc tin oxide ZnSnO (ZTO) where Sn and Zn are in various concentrations, preferably Zn:Sn are on a 1:1 ratio, a tin fluorine oxide $SnO_2$:F (FTO) where a portion of oxygen of tin(IV) oxide is replaced with a fluorine. The disclosed relates to development of tin-based precursors for the formation of tin-containing thin films by CVD, ALD or other chemical deposition methods, such as MLD, SOD, SOC, mist coating, dip coating, slit coating, spray coating, especially at low temperatures, such as 100° C. or lower, preferably 80° C. or lower. The tin-containing precursors disclosed herein likely fulfill such features and may be better alternatives to existing tin-containing precursors utilized today. Representative applications of the deposited tin-containing films include liquid crystal displays (LCDs), flat-panel displays, smart windows, transparent electrodes, antistatic coatings, thin film photovoltaics, glass coatings, solar cells, transistors, gas sensors, heat shield, etc.

As described above, TDMASn is a moisture-sensitive molecule that decomposes rapidly in air to generate $Me_2NH$ and $SnO_2$. This high reactivity arises from the presence of labile Sn—N bonds that play an important role to facilitate chemisorption on target substrates. Indeed, many of the tin-containing precursors suitable for low temperature ALD of Sn-containing films tend to have multiple Sn—N bonds regardless of the oxidation state of the metal center.

The disclosed tin-containing precursors are a class of amines bearing two stannyl groups, namely, distannazanes, which has the general formula of $$(R_3Sn)_2NR',$$

wherein R and R' each are independently H, a $C_1$ to $C_6$ linear, branched or cyclic alkyl group, or a $C_1$ to $C_4$ linear, branched or cyclic saturated hydrofluorocarbon group. The results of several distannazanes previously synthesized and characterized indicated that $(Me_3Sn)_2NR'$ where R'=Me or Et are liquid at ambient temperature consisting of excellent volatilities (e.g., 3 Torr at 64° C. for $(Me_3Sn)_2NMe$ and 15 Torr at 93° C. for $(Me_3Sn)_2NEt$). The disclosed distannazanes herein may be used as volatile precursors as alternatives to TDMASn to obtain films including thin films of Sn-containing materials such as $SnO_2$, ITO, and ZTO by chemical deposition methods, including, but being not limited to, CVD and ALD.

The advantage of this family of chemistries is that thermal properties may be adjusted by simply replacing the substituent, commonly an alkyl group, on the nitrogen center. Such substituents may be easily varied by utilizing the corresponding secondary amine, many of which are inexpensive and commercially available. Moreover, the synthesis of the tin-containing precursors disclosed herein are all achieved in either one- or two-step synthesis, displaying its convenience for mass production.

Exemplary examples of the disclosed Tin-containing precursors are as follows.

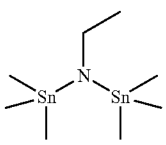
$(Me_3Sn)_2NEt$

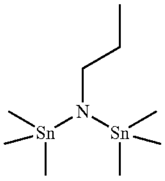
$(Me_3Sn)_2N$(nPr)

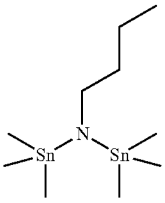
$(Me_3Sn)_2N$(nBu)

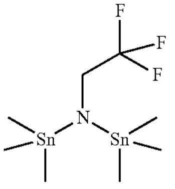
$(Me_3Sn)_2N(CH_2CF_3)$

The disclosed tin-containing precursors described above are all liquids at ambient temperature with excellent volatility and thermal stability, thus are easily purified by distillation and suitable for being used as a precursor for chemical depositions, such as, CVD, ALD or other chemical deposition methods, such as MLD, SOD, SOC, mist coating, dip coating, slit coating, spray coating, especially at low temperatures, such as 100° C. or lower, preferably 80° C. or lower.

Furthermore, the disclosed tin-containing precursors for the deposition of tin-containing thin films include, but are not limited to, $(Me_3Sn)_2N$(cyclo-Pr), $(Me_3Sn)_2N$(sBu), $(Me_3Sn)_2N$(cyclo-Bu), $(Me_3Sn)_2N$(1-Pen), $(Me_3Sn)_2N$(2-Pen), $(Me_3Sn)_2N$(3-Pen), $(Me_3Sn)_2N$(tPen), $(Me_3Sn)_2N$(neo-Pen), $(Me_3Sn)_2N$(cyclo-Pen), $(Me_3Sn)_2N$(2-Hex), $(Me_3Sn)_2N$(3-Hex), $(Me_3Sn)_2N$(tHex), $(Me_3Sn)_2N$(neo-Hex), $(Me_3Sn)_2N$(cyclo-Hex), $(Me_3Sn)_2N(CH_2CF_2CF_3)$, $(Me_3Sn)_2N(CH(CF_3)_2)$, $(Me_3Sn)_2N(CH_2(CF_2)_2CF_3)$, $(Me_3Sn)_2N(SiHMe_2)$, $(Me_3Sn)_2N(SiEtMe_2)$, $(Me_3Sn)_2N(SiEt_2Me)$, $(Me_3Sn)_2N(SiEt_3)$, $(Et_3Sn)_2NMe$, $(Et_3Sn)_2NEt$, $(Et_3Sn)_2N$(nPr), $(Et_3Sn)_2N$(iPr), $(Et_3Sn)_2N$(cyclo-Pr), $(Et_3Sn)_2N$(nBu), $(Et_3Sn)_2N$(sBu), $(Et_3Sn)_2N$(iBu), $(Et_3Sn)_2N$(tBu), $(Et_3Sn)_2N(CH_2CF_3)$, $(Et_3Sn)_2N(CH_2CF_2CF_3)$, $(Et_3Sn)_2N$(cyclo-Bu), $(Et_3Sn)_2N$(1-Pen), $(Et_3Sn)_2N$(2-Pen), $(Et_3Sn)_2N$(3-Pen), $(Et_3Sn)_2N$(tPen), $(Et_3Sn)_2N$(neo-Pen), $(Et_3Sn)_2N$(cyclo-Pen), $(Et_3Sn)_2N$(1-Hex), $(Et_3Sn)_2N$(2-Hex), $(Et_3Sn)_2N$(3-Hex), $(Et_3Sn)_2N$(tHex), $(Et_3Sn)_2N$(neo-Hex), $(Et_3Sn)_2N$(cyclo-Hex), $(Et_3Sn)_2N$(allyl), $(Et_3Sn)_2N(CH(CF_3)_2)$, $(Et_3Sn)_2N(CH_2(CF_2)_2CF_3)$, $(Et_3Sn)_2N(SiMe_3)$, $(Et_3Sn)_2N(SiHMe_2)$, $(Et_3Sn)_2N(SiEtMe_2)$, $(Et_3Sn)_2$ $N(SiEt_2Me)$, $(Et_3Sn)_2N(SiEt_3)$, $(nPr_3Sn)_2NMe$, $(nPr_3Sn)_2NEt$, $(nPr_3Sn)_2N$(nPr), $(nPr_3Sn)_2N$(iPr), $(nPr_3Sn)_2N$(cyclo-Pr), $(nPr_3Sn)_2N$(nBu), $(nPr_3Sn)_2N$(sBu), $(nPr_3Sn)_2N$(tBu), $(nPr_3Sn)_2N$(cyclo-Bu), $(nPr_3Sn)_2N$(1-Pen), $(nPr_3Sn)_2N$(2-Pen), $(nPr_3Sn)_2N$(3-Pen), $(nPr_3Sn)_2N$(tPen), $(nPr_3Sn)_2N$(neo-Pen), $(nPr_3Sn)_2N$(cyclo-Pen), $(nPr_3Sn)_2N$(1-Hex), $(nPr_3Sn)_2N$(2-Hex), $(nPr_3Sn)_2N$(3-Hex), $(nPr_3Sn)_2N$(tHex), $(nPr_3Sn)_2N$(neo-Hex), $(nPr_3Sn)_2N$(cyclo-Hex), $(nPr_3Sn)_2N$(allyl), $(nPr_3Sn)_2N(CH_2CF_3)$, $(nPr_3Sn)_2N(CH_2CF_3CF_3)$, $(nPr_3Sn)_2N(CH(CF_3)_2)$, $(nPr_3Sn)_2N(CH_2(CF_2)_2CF_3)$, $(nPr_3Sn)_2N(SiMe_3)$, $(nPr_3Sn)_2N(SiHMe_2)$, $(nPr_3Sn)_2N(SiEtMe_2)$, $(nPr_3Sn)_2N(SiEt_2Me)$, $(nPr_3Sn)_2N(SiEt_3)$, $(nPr_3Sn)_2NH$, $(nBu_3Sn)_2NMe$, $(nBu_3Sn)_2NEt$, $(nBu_3Sn)_2NMe$, $(nBu_3Sn)_2N$(nPr), $(nBu_3Sn)_2N$(iPr), $(nBu_3Sn)_2N$(cyclo-Pr), $(nBu_3Sn)_2N$(nBu), $(nBu_3Sn)_2N$(sBu), $(nBu_3Sn)_2N$(tBu), $(nBu_3Sn)_2N$(cyclo-Bu), $(nBu_3Sn)_2N$(1-Pen), $(nBu_3Sn)_2N$(2-Pen), $(nBu_3Sn)_2N$(3-Pen), $(nBu_3Sn)_2N$(tPen), $(nBu_3Sn)_2N$(neo-Pen), $(nBu_3Sn)_2N$(cyclo-Pen), $(nBu_3Sn)_2N$(1-Hex), $(nBu_3Sn)_2N$(2-Hex), $(nBu_3Sn)_2N$(3-Hex), $(nBu_3Sn)_2N$(tHex), $(nBu_3Sn)_2N$(neo-Hex), $(nBu_3Sn)_2N$(cyclo-Hex), $(nBu_3Sn)_2N$(allyl), $(nBu_3Sn)_2N(CH_2CF_3)$, $(nBu_3Sn)_2N(CH_2CF_3CF_3)$, $(nBu_3Sn)_2N(CH(CF_3)_2)$, $(nBu_3Sn)_2N(CH_2(CF_2)_2CF_3)$, $(nBu_3Sn)_3N$, $(nBu_3Sn)_2N(SiMe_3)$, $(nBu_3Sn)_2N(SiHMe_2)$, $(nBu_3Sn)_2N(SiEtMe_2)$, $(nBu_3Sn)_2N(SiEt_2Me)$, $(nBu_3Sn)_2N(SiEt_3)$, $(nBu_3Sn)_2NH$, $(nPen_3Sn)_2NMe$, $(nPen_3Sn)_2NEt$, $(nPen_3Sn)_2N$(nPr), $(nPen_3Sn)_2N$(iPr), $(nPen_3Sn)_2N$(cyclo-Pr), $(nPen_3Sn)_2N$(nBu), $(nPen_3Sn)_2N$(sBu), $(nPen_3Sn)_2N$(tBu), $(nPen_3Sn)_2N$(cyclo-Bu), $(nPen_3Sn)_2N$(1-Pen), $(nPen_3Sn)_2N$(2-Pen), $(nPen_3Sn)_2N$(3-Pen), $(nPen_3Sn)_2N$(tPen), $(nPen_3Sn)_2N$(neo-Pen), $(nPen_3Sn)_2N$(cyclo-Pen), $(nPen_3Sn)_2N$(1-Hex), $(nPen_3Sn)_2N$(2-Hex), $(nPen_3Sn)_2N$(3-Hex), $(nPen_3Sn)_2N$(tHex), $(nPen_3Sn)_2N$(neo-Hex), $(nPen_3Sn)_2N$(cyclo-Hex), $(nPen_3Sn)_2N$(allyl), $(nPen_3Sn)_2N(CH_2CF_3)$, $(nPen_3Sn)_2N(CH_2CF_3CF_3)$, $(nPen_3Sn)_2N(CH(CF_3)_2)$, $(nPen_3Sn)_2N(CH_2(CF_2)_2CF_3)$, $(nPen_3Sn)_3N$, $(nPen_3Sn)_2N(SiMe_3)$, $(nPen_3Sn)_2N(SiHMe_2)$, $(nPen_3Sn)_2N(SiEtMe_2)$, $(nPen_3Sn)_2N(SiEt_2Me)$, $(nPen_3Sn)_2N(SiEt_3)$, $(nPen_3Sn)_2NH$, $(nHex_3Sn)_2NMe$, $(nHex_3Sn)_2NEt$, $(nHex_3Sn)_2NMe$, $(nHex_3Sn)_2NEt$, $(nHex_3Sn)_2N$(nPr), $(nHex_3Sn)_2N$(iPr), $(nHex_3Sn)_2N$(cyclo-Pr), $(nHex_3Sn)_2N$(nBu), $(nHex_3Sn)_2N$(sBu), $(nHex_3Sn)_2N$(tBu), $(nHex_3Sn)_2N$(cyclo-Bu), $(nHex_3Sn)_2N$(1-Pen), $(nHex_3Sn)_2N$(2-Pen), $(nHex_3Sn)_2N$(3-Pen), $(nHex_3Sn)_2N$(tPen), $(nHex_3Sn)_2N$(neo-Pen), $(nHex_3Sn)_2N$(cyclo-Pen), $(nHex_3Sn)_2N$(1-Hex), $(nHex_3Sn)_2N$(2-Hex), $(nHex_3Sn)_2N$(3-Hex), $(nHex_3Sn)_2N$(tHex), $(nHex_3Sn)_2N$(neo-Hex), $(nHex_3Sn)_2N$(cyclo-Hex), $(nHex_3Sn)_2N$(allyl), $(nHex_3Sn)_2N(CH_2CF_3)$, $(nHex_3Sn)_2N(CH_2CF_3CF_3)$, $(nHex_3Sn)_2N(CH(CF_3)_2)$, $(nHex_3Sn)_2N(CH_2(CF_2)_2CF_3)$, $(nHex_3Sn)_3N$, $(nHex_3Sn)_2N(SiMe_3)$, $(nHex_3Sn)_2N(SiHMe_2)$, $(nHex_3Sn)_2N(SiEtMe_2)$, $(nHex_3Sn)_2$ $N(SiEt_2Me)$, $(nHex_3Sn)_2N(SiEt_3)$, $(nHex_3Sn)_2NH$, $(EtMe_2Sn)_2NMe$, $(EtMe_2Sn)_2NEt$, $(EtMe_2Sn)_2NMe$, $(EtMe_2Sn)_2NEt$, $(EtMe_2Sn)_2N$(nPr), $(EtMe_2Sn)_2N$(iPr), $(EtMe_2)_2N$(cyclo-Pr), $(EtMe_2)_2N$(nBu), $(EtMe_2Sn)_2N$(sBu), $(EtMe_2Sn)_2N$(tBu), $(EtMe_2)_2N$(cyclo-Bu), $(EtMe_2Sn)_2N$(1-Pen), $(EtMe_2Sn)_2N$(2-Pen), $(EtMe_2Sn)_2N$(3-Pen), $(EtMe_2Sn)_2N$(tPen), $(EtMe_2Sn)_2N$(neo-Pen), $(EtMe_2Sn)_2N$(cyclo-Pen), $(EtMe_2Sn)_2N$(1-Hex), $(EtMe_2Sn)_2N$(2-Hex), $(EtMe_2Sn)_2N$(3-Hex), $(EtMe_2Sn)_2N$ (tHex), $(EtMe_2Sn)_2N$(neo-Hex), $(EtMe_2Sn)_2N$(cyclo-Hex), $(EtMe_2Sn)_2N$(allyl), $(EtMe_2Sn)_2N(CH_2CF_3)$, $(EtMe_2Sn)_2N(CH_2CF_3CF_3)$, $(EtMe_2Sn)_2N(CH(CF_3)_2)$, $(EtMe_2Sn)_2N(CH_2(CF_2)_2CF_3)$, $(EtMe_2Sn)_3N$, $(EtMe_2Sn)_2N(SiMe_3)$, $(EtMe_2Sn)_2N(SiHMe_2)$, $(EtMe_2Sn)_2N(SiEtMe_2)$, $(EtMe_2Sn)_2N(SiEt_2Me)$, $(EtMe_2Sn)_2N(SiEt_3)$, $(EtMe_2Sn)_2NH$, $(nPrMe_2Sn)_2NMe$, $(nPrMe_2Sn)_2NEt$, $(nPrMe_2Sn)_2NMe$, $(nPrMe_2Sn)_2NEt$, $(nPrMe_2Sn)_2N$(nPr), $(nPrMe_2Sn)_2N$(iPr), $(nPrMe_2)_2N$(cyclo-Pr), $(nPrMe_2)_2N$(nBu), $(nPrMe_2Sn)_2N$(sBu), $(nPrMe_2Sn)_2N$(tBu), $(nPrMe_2)_2N$(cyclo-Bu), $(nPrMe_2Sn)_2N$(1-Pen), $(nPrMe_2Sn)_2N$(2-Pen), $(nPrMe_2Sn)_2N$(3-Pen), $(nPrMe_2Sn)_2N$(tPen), $(nPrMe_2Sn)_2N$(neo-Pen), $(nPrMe_2Sn)_2N$(cyclo-Pen), $(nPrMe_2Sn)_2N$(1-Hex), $(nPrMe_2Sn)_2N$(2-Hex), $(nPrMe_2Sn)_2N$(3-Hex), $(nPrMe_2Sn)_2N$(tHex), $(nPrMe_2Sn)_2N$(neo-Hex), $(nPrMe_2Sn)_2N$(cyclo-Hex), $(nPrMe_2Sn)_2N$(allyl), $(nPrMe_2Sn)_2N(CH_2CF_3)$, $(nPrMe_2Sn)_2N(CH_2CF_3CF_3)$, $(nPrMe_2Sn)_2N(CH(CF_3)_2)$, $(nPrMe_2Sn)_2N(CH_2(CF_2)_2CF_3)$, $(nPrMe_2Sn)_3N$, $(nPrMe_2Sn)_2N(SiMe_3)$, $(nPrMe_2Sn)_2N(SiHMe_2)$, $(nPrMe_2Sn)_2N(SiEtMe_2)$, $(nPrMe_2Sn)_2N(SiEt_2Me)$, $(nPrMe_2Sn)_2N(SiEt_3)$, $(nPrMe_2Sn)_2NH$, $(iPrMe_2Sn)_2NMe$, $(iPrMe_2Sn)_2NEt$, $(iPrMe_2Sn)_2N$(nPr), $(iPrMe_2Sn)_2N$(iPr), $(iPrMe_2)_2N$(cyclo-Pr), $(iPrMe_2)_2N$(nBu), $(iPrMe_2Sn)_2N$(sBu), $(iPrMe_2Sn)_2N$(tBu), $(iPrMe_2)_2N$(cyclo-Bu), $(iPrMe_2Sn)_2N$(1-Pen), $(iPrMe_2Sn)_2N$(2-Pen), $(iPrMe_2Sn)_2N$(3-Pen), $(iPrMe_2Sn)_2N$(tPen), $(iPrMe_2Sn)_2N$(neo-Pen), $(iPrMe_2Sn)_2N$(cyclo-Pen), $(iPrMe_2Sn)_2N$(1-Hex), $(iPrMe_2Sn)_2N$(2-Hex), $(iPrMe_2Sn)_2N$(3-Hex), $(iPrMe_2Sn)_2N$(tHex), $(iPrMe_2Sn)_2N$(neo-Hex), $(iPrMe_2Sn)_2N$(cyclo-Hex), $(iPrMe_2Sn)_2N$(allyl), $(iPrMe_2Sn)_2N(CH_2CF_3)$, $(iPrMe_2Sn)_2N(CH_2CF_3CF_3)$, $(iPrMe_2Sn)_2N(CH(CF_3)_2)$, $(iPrMe_2Sn)_2N(CH_2(CF_2)_2CF_3)$, $(iPrMe_2Sn)_2N(SiMe_3)$, $(iPrMe_2Sn)_2N(SiHMe_2)$, $(iPrMe_2Sn)_2N(SiEtMe_2)$, $(iPrMe_2Sn)_2N(SiEt_2Me)$, $(iPrMe_2Sn)_2N(SiEt_3)$, $(iPrMe_2Sn)_2NH$, $(nBuMe_2Sn)_2NMe$, $(nBuMe_2Sn)_2NEt$, $(nBuMe_2Sn)_2NMe$, $(nBuMe_2Sn)_2NEt$, $(nBuMe_2Sn)_2N$(nPr), $(nBuMe_2Sn)_2N$(iPr), $(nBuMe_2)_2N$(cyclo-Pr), $(nBuMe_2)_2N$(nBu), $(nBuMe_2Sn)_2N$(sBu), $(nBuMe_2Sn)_2N$(tBu), $(nBuMe_2)_2N$(cyclo-Bu), $(nBuMe_2Sn)_2N$(1-Pen), $(nBuMe_2Sn)_2N$(2-Pen), $(nBuMe_2Sn)_2N$(3-Pen), $(nBuMe_2Sn)_2N$(tPen), $(nBuMe_2Sn)_2N$(neo-Pen), $(nBuMe_2Sn)_2N$(cyclo-Pen), $(nBuMe_2Sn)_2N$(1-Hex), $(nBuMe_2Sn)_2N$(2-Hex), $(nBuMe_2Sn)_2N$(3-Hex), $(nBuMe_2Sn)_2N$(tHex), $(nBuMe_2Sn)_2N$(neo-Hex), $(nBuMe_2Sn)_2N$(cyclo-Hex), $(nBuMe_2Sn)_2N$(allyl), $(nBuMe_2Sn)_2N(CH_2CF_3)$, $(nBuMe_2Sn)_2N(CH_2CF_3CF_3)$, $(nBuMe_2Sn)_2N(CH(CF_3)_2)$, $(nBuMe_2Sn)_2N(CH_2(CF_2)_2CF_3)$, $(nBuMe_2Sn)_3N$, $(nBuMe_2Sn)_2N(SiMe_3)$, $(nBuMe_2Sn)_2N(SiHMe_2)$, $(nBuMe_2Sn)_2N(SiEtMe_2)$, $(nBuMe_2Sn)_2N(SiEt_2Me)$, $(nBuMe_2Sn)_2N(SiEt_3)$, $(nBuMe_2Sn)_2NH$, $(sBuMe_2Sn)_2NMe$, $(sBuMe_2Sn)_2NEt$, $(sBuMe_2Sn)_2NMe$, $(sBuMe_2Sn)_2NEt$, $(sBuMe_2Sn)_2N$(nPr), $(sBuMe_2Sn)_2N$(iPr), $(sBuMe_2)_2N$(cyclo-Pr), $(sBuMe_2)_2N$(nBu), $(sBuMe_2Sn)_2N$(sBu), $(sBuMe_2Sn)_2N$(tBu), $(sBuMe_2)_2N$(cyclo-Bu), $(sBuMe_2Sn)_2N$(1-Pen), $(sBuMe_2Sn)_2N$(2-Pen), $(sBuMe_2Sn)_2N$(3-Pen), $(sBuMe_2Sn)_2N$(tPen), $(sBuMe_2Sn)_2N$(neo-Pen), $(sBuMe_2Sn)_2N$(cyclo-Pen), $(sBuMe_2Sn)_2N$(1-Hex), $(sBuMe_2Sn)_2N$(2-Hex), $(sBuMe_2Sn)_2N$(3-Hex), $(sBuMe_2Sn)_2N$(tHex), $(sBuMe_2Sn)_2N$(neo-Hex), $(sBuMe_2Sn)_2N$(cyclo-Hex), $(sBuMe_2Sn)_2N$(allyl), $(sBuMe_2Sn)_2N(CH_2CF_3)$, $(sBuMe_2Sn)_2N(CH_2CF_3CF_3)$, $(sBuMe_2Sn)_2N(CH(CF_3)_2)$, $(sBuMe_2Sn)_2N(CH_2(CF_2)_2CF_3)$, $(sBuMe_2Sn)_3N$, $(sBuMe_2Sn)_2N(SiMe_3)$, $(sBuMe_2Sn)_2N(SiHMe_2)$, $(sBuMe_2Sn)_2N(SiEtMe_2)$, $(sBuMe_2Sn)_2N(SiEt_2Me)$, $(sBuMe_2Sn)_2N(SiEt_3)$, $(sBuMe_2Sn)_2NH$, $(tBuMe_2Sn)_2NMe$, $(tBuMe_2Sn)_2NEt$, $(tBuMe_2Sn)_2NMe$, $(tBuMe_2Sn)_2NEt$, $(tBuMe_2Sn)_2N$(nPr), $(tBuMe_2Sn)_2N$(iPr), $(tBuMe_2)_2N$(cyclo-Pr), $(tBuMe_2)_2N$(nBu), $(tBuMe_2Sn)_2N$(sBu), $(tBuMe_2Sn)_2N$(tBu), $(tBuMe_2)_2N$(cyclo-Bu), $(tBuMe_2Sn)_2N$(1-Pen), $(tBuMe_2Sn)_2N$(2-Pen), $(tBuMe_2Sn)_2N$(3-Pen), $(tBuMe_2Sn)_2N$(tPen), $(tBuMe_2Sn)_2N$(neo-Pen), $(tBuMe_2Sn)_2N$(cyclo-Pen), $(tBuMe_2Sn)_2N$(1-Hex), $(tBuMe_2Sn)_2N$(2-Hex), $(tBuMe_2Sn)_2N$(3-Hex), $(tBuMe_2Sn)_2N$(tHex), $(tBuMe_2Sn)_2N$(neo-Hex), $(tBuMe_2Sn)_2N$(cyclo-Hex), $(tBuMe_2Sn)_2N$(allyl), $(tBuMe_2Sn)_2N(CH_2CF_3)$, $(tBuMe_2Sn)_2N(CH_2CF_3CF_3)$, $(tBuMe_2Sn)_2N(CH(CF_3)_2)$, $(tBuMe_2Sn)_2N(CH_2(CF_2)_2CF_3)$, $(tBuMe_2Sn)_3N$, $(tBuMe_2Sn)_2N(SiMe_3)$, $(tBuMe_2Sn)_2N(SiHMe_2)$, $(tBuMe_2Sn)_2N(SiEtMe_2)$, $(tBuMe_2Sn)_2N(SiEt_2Me)$, $(tBuMe_2Sn)_2N(SiEt_3)$, $(tBuMe_2Sn)_2NH$, $(Me_2HSn)_2NMe$, $(Me_2HSn)_2NEt$, $(Me_2HSn)_2N$(nPr), $(Me_2HSn)_2N$(iPr), $(Me_2HSn)_2N$(cyclo-Pr), $(Me_2HSn)_2N$(nBu), $(Me_2HSn)_2N$(sBu), $(Me_2HSn)_2N$(iBu), $(Me_2HSn)_2N$(tBu), $(Me_2HSn)_2N$(cyclo-Bu), $(Me_2HSn)_2N$(1-Pen), $(Me_2HSn)_2N$(2-Pen), $(Me_2HSn)_2N$(3-Pen), $(Me_2HSn)_2N$(tPen), $(Me_2HSn)_2N$(neo-Pen), $(Me_2HSn)_2N$(cyclo-Pen), $(Me_2HSn)_2N$(1-Hex), $(Me_2HSn)_2N$(2-Hex), $(Me_2HSn)_2N$(3-Hex), $(Me_2HSn)_2N$(tHex), $(Me_2HSn)_2N$(neo-Hex), $(Me_2HSn)_2N$(cyclo-Hex), $(Me_2HSn)_2N$(allyl), $(Me_2HSn)_2N(CH_2CF_3)$, $(Me_2HSn)_2N(CH_2CF_2CF_3)$, $(Me_2HSn)_2N(CH(CF_3)_2)$, $(Me_2HSn)_2N(CH_2(CF_2)_2CF_3)$, $(Me_2HSn)_3N$, $(Me_2HSn)_2N(SiMe_3)$, $(Me_2HSn)_2N(SiHMe_2)$, $(Me_2HSn)_2N(SiEtMe_2)$, $(Me_2HSn)_2N(SiEt_2Me)$, $(Me_2HSn)_2N(SiEt_3)$, $(Me_2HSn)_2NH$, $(Me_2HSn)_3N$, $(MeH_2Sn)_2NMe$, $(MeH_2Sn)_2NEt$, $(MeH_2Sn)_2N$(nPr), $(MeH_2Sn)_2N$(iPr), $(MeH_2Sn)_2N$(cyclo-Pr), $(MeH_2Sn)_2N$(nBu), $(MeH_2Sn)_2N$(sBu), $(MeH_2Sn)_2N$(tBu), $(MeH_2Sn)_2N$(cyclo-Bu), $(MeH_2Sn)_2N$(1-Pen), $(MeH_2Sn)_2N$(2-Pen), $(MeH_2Sn)_2N$(3-Pen), $(MeH_2Sn)_2N$(tPen), $(MeH_2Sn)_2N$(neo-Pen), $(MeH_2Sn)_2N$(cyclo-Pen), $(MeH_2Sn)_2N$(1-Hex), $(MeH_2Sn)_2N$(2-Hex), $(MeH_2Sn)_2N$(3-Hex), $(MeH_2Sn)_2N$(tHex), $(MeH_2Sn)_2N$(neo-Hex), $(MeH_2Sn)_2N$(cyclo-Hex), $(MeH_2Sn)_2N$(allyl), $(MeH_2Sn)_2N(CH_2CF_3)$, $(MeH_2Sn)_2N(CH_2CF_3CF_3)$, $(MeH_2Sn)_2N(CH(CF_3)_2)$, $(MeH_2Sn)_2N(CH_2(CF_2)_2CF_3)$, $(MeH_2Sn)_3N$, $(MeH_2Sn)_2N(SiMe_3)$, $(MeH_2Sn)_2N(SiHMe_2)$, $(MeH_2Sn)_2N(SiEtMe_2)$, $(MeH_2Sn)_2N(SiEt_2Me)$, $(MeH_2Sn)_2N(SiEt_3)$, $(MeH_2Sn)_2NH$, $(H_3Sn)_2NMe$, $(H_3Sn)_2NEt$, $(H_3Sn)_2N$(nPr), $(H_3Sn)_2N$(iPr), $(H_3Sn)_2N$(cyclo-Pr), $(H_3Sn)_2N$(nBu), $(H_3Sn)_2N$(sBu), $(H_3Sn)_2N$(tBu), $(H_3Sn)_2N$(cyclo-Bu), $(H_3Sn)_2N$(1-Pen), $(H_3Sn)_2N$(2-Pen), $(H_3Sn)_2N$(3-Pen), $(H_3Sn)_2N$(tPen), $(H_3Sn)_2N$(neo-Pen), $(H_3Sn)_2N$(cyclo-Pen), $(H_3Sn)_2N$(1-Hex), $(H_3Sn)_2N$(2-Hex), $(H_3Sn)_2N$(3-Hex), $(H_3Sn)_2N$(tHex), $(H_3Sn)_2N$(neo-Hex), $(H_3Sn)_2N$(cyclo-Hex), $(H_3Sn)_2N$(allyl), $(H_3Sn)_2N(CH_2CF_3)$, $(H_3Sn)_2N(CH_2CF_3CF_3)$, $(H_3Sn)_2N(CH(CF_3)_2)$, $(H_3Sn)_2N(CH_2(CF_2)_2CF_3)$, $(H_3Sn)_3N$, $(H_3Sn)_2N(SiMe_3)$, $(H_3Sn)_2N(SiHMe_2)$, $(H_{32}Sn)_2N(SiEtMe_2)$, $(H_3Sn)_2N(SiEt_2Me)$, $(H_3Sn)_2N(SiEt_3)$, $(Et_2HSn)_2NMe$, $(Et_2HSn)_2NEt$, $(Et_2HSn)_2N$(nPr), $(Et_2HSn)_2N$(cyclo-Pr), $(Et_2HSn)_2N$(nBu), $(Et_2HSn)_2N$(sBu), $(Et_2HSn)_2N$(tBu), $(Et_2HSn)_2N$(cyclo-Bu), $(Et_2HSn)_2N$(1-Pen), $(Et_2HSn)_2N$(2-Pen), $(Et_2HSn)_2N$(3-Pen), $(Et_2HSn)_2N$(tPen), $(Et_2HSn)_2N$(neo-Pen), $(Et_2HSn)_2N$(cyclo-Pen), $(Et_2HSn)_2N$(1-Hex), $(Et_2HSn)_2N$(2-Hex), $(Et_2HSn)_2N$(3-Hex), $(Et_2HSn)_2N$(tHex), $(Et_2HSn)_2N$(neo-Hex), $(Et_2HSn)_2N$(cyclo-Hex), $(Et_2HSn)_2N$(allyl), $(Et_2HSn)_2N(CH(CF_3)_2)$, $(Et_2HSn)_2N(CH_2(CF_2)_2CF_3)$, $(Et_2HSn)_3N$, $(Et_2HSn)_2N(SiMe_3)$, $(Et_2HSn)_2N(SiHMe_2)$, $(Et_2HSn)_2N(SiEtMe_2)$, $(Et_2HSn)_2N(SiEt_2Me)$, $(Et_2HSn)_2N(SiEt_3)$, $(Et_2HSn)_2NH$, $(EtH_2Sn)_2NMe$, $(EtH_2Sn)_2NEt$, $(EtH_2Sn)_2N$(nPr), $(EtH_2Sn)_2N$(iPr), $(EtH_2Sn)_2N$(cyclo-Pr), $(EtH_2Sn)_2N$(nBu), $(EtH_2Sn)_2N$(sBu), $(EtH_2Sn)_2N$(tBu), $(EtH_2Sn)_2N$(cyclo-Bu), $(EtH_2Sn)_2$ N(1-Pen), $(EtH_2Sn)_2N$(2-Pen), $(EtH_2Sn)_2N$(3-Pen), $(EtH_2Sn)_2N$(tPen), $(EtH_2Sn)_2N$(neo-Pen), $(EtH_2Sn)_2N$(cyclo-Pen), $(EtH_2Sn)_2N$(1-Hex), $(EtH_2Sn)_2N$(2-Hex), $(EtH_2Sn)_2N$(3-Hex), $(EtH_2Sn)_2N$(tHex), $(EtH_2Sn)_2N$(neo-Hex), $(EtH_2Sn)_2N$(cyclo-Hex), $(EtH_2Sn)_2N$(allyl), $(EtH_2Sn)_2N(CH_2CF_3)$, $(EtH_2Sn)_2N(CH_2CF_3CF_3)$, $(EtH_2Sn)_2N(CH(CF_3)_2)$, $(EtH_2Sn)_2N(CH_2(CF_2)_2CF_3)$, $(EtH_2Sn)_3N$, $(EtH_2Sn)_2N(SiMe_3)$, $(EtH_2Sn)_2N(SiHMe_2)$, $(EtH_2Sn)_2N(SiEtMe_2)$, $(EtH_2Sn)_2N(SiEt_2Me)$, $(EtH_2Sn)_2N(SiEt_3)$ and $(EtH_2Sn)_2NH$.

The disclosed tin-containing precursors and the disclosed film-forming compositions are suitable to deposit the corresponding element-containing films and its related use for deposition of the corresponding element-containing layers. The disclosed tin-containing precursors and the disclosed film-forming compositions are suitable for forming tin-containing thin films, such as tin oxide, $SnO_2$, InSnO (ITO), ZnSnO (ZTO), SnN, SnP, SnAs, SnSb, $SnS_2$, used in electronic fields.

The disclosed tin-containing precursors may be useful for the fabrication of tin dioxide for various applications including gas sensors, photovoltaics, CMOS, high capacity electrode material, catalysis, LED applications, optical applications, components of ITO and ZTO in displays, semiconductors, logic, memories industries among others.

The disclosed also include processes to form tin-containing deposits, such as tin-containing films, tin-containing dots, or continuous, partially continuous, and non-continuous tin-containing films, using the disclosed tin-containing precursors through chemical deposition methods, in combination with or without one or more co-reactants. The disclosed processes are deposition processes where the disclosed tin-containing precursors are used and introduced into a reaction chamber for deposition a film by the chemical deposition methods such as CVD, ALD, molecular layer deposition (MLD), spin on dielectric (SOD), mist coating, dip coating, slit coating, spin on coating (SOC), spray coating, or any other deposition techniques to form a film, in combination with or without one or more oxidants (for example $O_2$ and $O_3$, or $H_2O$ and $O_3$), or with or without one or more reductants or nitriding agents (for example $H_2$ and $NH_3$, $N_2$ and $NH_3$, or $NH_3$ and $N_2H_4$) introduced simultaneously and/or sequentially into the reaction chamber. The disclosed deposition processes using the disclosed tin-containing precursors may be assisted by heating, light, direct or remote plasma, or combination thereof.

The co-reactants may be oxygen sources, an oxygen-containing gas or an oxidant or an oxidizer. The oxygen-containing gas includes, but is not limited to, oxidizers such as, $O_2$, $O_3$, $H_2O$, $H_2O_2$, NO, $N_2O$, $NO_2$, O radicals, alcohol, silanols, aminoalcohols, carboxylic acids, para-formaldehyde, other nitrogen-oxygen molecules, or combinations thereof. Preferably the oxygen-containing gas is $O_3$ or $O_2$. Alternatively, the co-reactant may be a N-source, a nitrogen-containing gas or a reducing gas or a reductant or a reductant. The nitrogen-containing gas includes, but is not limited to, $NH_3$, $N_2$, $H_2$, $N_2/H_2$, $H_2$ and $NH_3$, $N_2$ and $NH_3$, $NH_3$ and $N_2H_4$, NO, $N_2O$, amines, diamines, cyanides, di-imines, hydrazines, organic amines, pyrazoline, pyridine, primary amines such as methylamine, ethylamine, tertbutylamine; secondary amines such as dimethylamine, diethylamine, di-isopropylamine, ethylmethylamine, pyrrolidine; tertiary amines such as trimethylamine, triethylamine, trisilylamine, or mixture thereof. Preferably the nitrogen-containing gas is $NH_3$. Alternatively, the co-reactant may be a P-source such as $PH_3$. Alternatively, the co-reactant may be a S-source such as $H_2S$, mercaptan, and combination thereof. The process may be, for instance, assisted by heating of the substrate, using direct or remote plasma, and/or irradiation of light with wavelengths from 120 to 800 nm. Such a process shall lead to formation of tin-containing thin films with a non-uniformity lower than 4% at a temperature range of 50 to 400° C.

When the target deposited film is a conductive film, the co-reactant may be $H_2$, $H_2CO$, $N_2H_4$, $NH_3$, a primary amine, a secondary amine, a tertiary amine, trisilylamine, radicals thereof, and mixtures thereof. Preferably, the co-reactant is $H_2$ or $NH_3$. Alternatively, when the target deposited film is a dielectric film, the co-reactant may be an oxidizing gas such as one of $O_2$, $O_3$, $H_2O$, $H_2O_2$, NO, $N_2O$, $NO_2$, oxygen containing radicals such as O·, OH·, carboxylic acids, formic acid, acetic acid, propionic acid, and mixtures thereof. Preferably, the oxidizing gas is selected from the group consisting of $O_3$, $H_2O_2$ and $H_2O$.

Furthermore, the co-reactant may be treated by a plasma, in order to decompose the reactant into its radical form, at least one of $H_2$, $N_2$ and $O_2$ may be utilized as a hydrogen, nitrogen or oxygen source gas, respectively, when treated with plasma. The plasma source may be a $N_2$ plasma, $N_2$/He plasma, $N_2$/Ar plasma, $NH_3$ plasma, $NH_3$/He plasma, $NH_2$/AR plasma, He plasma, Ar plasma, $H_2$ plasma, $H_2$/He plasma, $H_2$/organic amine plasma, and mixtures thereof. For instance, the plasma may be generated with a power ranging from about 10 W to about 1000 W, preferably from about 50 W to about 500 W. The plasma may be generated present within the reaction chamber itself. Alternatively, the plasma may generally be at a location removed from the reaction chamber, for instance, in a remotely located plasma system. For example, the co-reactant may be introduced into a direct plasma reaction chamber, which generates plasma in the reaction chamber, to produce the plasma-treated reactant in the reaction chamber. Alternatively, the plasma processing may occur simultaneously with the introduction of the reactant.

Alternatively, the plasma-treated co-reactant may be produced outside of the reaction chamber, for example, a remote plasma to treat the co-reactant prior to passage into the reaction chamber.

Also disclosed are methods for forming tin-containing layers on a substrate using a vapor deposition process. Applicants believe that the disclosed film-forming compositions are suitable for ALD. More particularly, the disclosed film-forming compositions are capable of surface saturation, self-limited growth per cycle, and perfect step coverage on aspects ratios ranging from approximately 2:1 to approximately 200:1, and preferably from approximately 20:1 to approximately 100:1. Additionally, the disclosed film-forming compositions have high decomposition temperatures, indicating good thermal stability to enable ALD. The high decomposition temperatures permit ALD at higher temperatures (e.g., approximately 600° C.), resulting in films having higher purity. The disclosed methods may be useful in the manufacture of semiconductor, photovoltaic, LCD-TFT, flat panel type devices.

The disclosed film-forming compositions may be used to deposit films using any deposition methods known to those of skill in the art. Examples of suitable vapor deposition methods include CVD and ALD. Exemplary CVD methods include thermal CVD, plasma enhanced CVD (PECVD), pulsed CVD (PCVD), low pressure CVD (LPCVD), sub-atmospheric CVD (SACVD) atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial ALD, hot-wire ALD (HWALD), radicals incorporated ALD, and combinations thereof, Super critical fluid deposition may also be used, such as molecular layer deposition (MLD), spin-on deposition (SOD), spin-on coating (SOC), mist coating, dip coating, slit coating, spray coating. The deposition method is preferably ALD, PE-ALD, spatial ALD in order to provide suitable step coverage and film thickness control. The disclosed film-forming compositions may be used to deposit films using any deposition methods known to those of skill in the art, especially at low temperatures, such as 100° C. or lower, preferably 80° C. or lower.

Purity of the disclosed film-forming composition is greater than 95% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to 100.0% w/w). One of ordinary skill in the art will recognize that the purity may be determined by H NMR and gas liquid chromatography with mass spectrometry. The disclosed film-forming compositions may contain any of the following impurities: pyrazoles; pyridines; alkylamines; alkylimines; THF; ether; pentane; cyclohexane; heptanes; benzene; toluene; chlorinated metal compounds; lithium, sodium, potassium pyrazolyl. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The disclosed film-forming composition may be purified by recrystallisation, sublimation, distillation, and/or passing the gas liquid through a suitable adsorbent, such as a 4 Å molecular sieve.

Purification of the disclosed film-forming composition may also result in metal impurities at the 0 ppbw to 1 ppmw, preferably 0-500 ppbw (part per billion weight) level. These metal impurities may include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Indium (In), and Titanium (Ti).

The disclosed film-forming compositions may be supplied either in a neat form or in a blend with a suitable solvent, such as ethyl benzene, xylene, mesitylene, decalin, decane, dodecane. The disclosed precursors may be present in varying concentrations in the solvent.

The neat or blended film-forming compositions are introduced into a reaction chamber in a vapor form by conventional means, such as tubing and/or flow meters. The vapor form may be produced by vaporizing the neat or blended composition through a conventional vaporization step such as direct vaporization, distillation, by bubbling, or by using a sublimator. The neat or blended composition may be fed in liquid state to a vaporizer where it is vaporized before it is introduced into the reaction chamber. Alternatively, the neat or blended composition may be vaporized by passing a carrier gas into a container containing the composition by bubbling the carrier gas into the composition. The carrier gas may include, but is not limited to, Ar, He, $N_2$, and mixtures thereof. Bubbling with a carrier gas may also remove any dissolved oxygen present in the neat or blended composition. The carrier gas and composition are then introduced into the reaction chamber as a vapor.

If necessary, a container containing the disclosed film-forming composition may be heated to a temperature that permits the composition to be in its liquid phase and to have a sufficient vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The reaction chamber may be any enclosure chamber within a device in which deposition methods take place such as without limitation, a parallel-plate type reaction chamber, a cold-wall type reaction chamber, a hot-wall type reaction chamber, a single-wafer reaction chamber, a multi-wafer reaction chamber, other types of deposition systems under conditions suitable to cause the compounds to react and form the layers. One of ordinary skill in the art will recognize that any of these reaction chambers may be used for either ALD or CVD deposition processes.

The reaction chamber contains one more substrates onto which the films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one more layers of differing materials deposited on it from a previous manufacturing step. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide metal nitride layers (Ti, Ru, Ta, etc.), and combinations thereof. Additionally, the wafers may include copper layers, noble metal layers (e.g., platinum, palladium, rhodium, gold). The wafers may include barrier layers, such as manganese, manganese oxide, etc. Plastic layers may also be used. The layers may be planar or patterned. The disclosed processes may deposit the layer directly on the wafer or directly on one or more layers on top of the wafer when patterned layers are formed on the substrate. The patterned layers may be alternating layers of two specific layers such as SiO and SiN used in 3D NAND. Furthermore, one of ordinary skill in the art will recognize that the terms "film" "layer" used herein refer to a thickness of some material laid on spread over a surface and that the surface may be a trench a line. Throughout the specification and claims, the wafer and any associated layers thereon are referred to as substrates. For example, an Indium oxide film may be deposited onto a metal oxide layer, such as a $ZrO_2$ layer, an $HfO_2$ layer, a $MoO_2$ layer.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reactor are held at conditions suitable for vapor depositions, such as ALD and CVD. In other words, after introduction of the vaporized disclosed film-forming composition into the chamber, conditions within the chamber are at least part of the precursor is deposited onto the substrate to form a layer. For instance, the pressure in the reactor or the deposition pressure may be held between about $10^{-3}$ Torr and about 100 Torr, more preferably between about $10^{-2}$ Torr and about 100 Torr, as required per the deposition parameters. Likewise, the temperature in the reactor or the deposition temperature may be held between room temperature and about 600° C., preferably between room temperature and about 500° C., more preferably between room temperature and about 200° C., even more preferably between room temperature and about 100° C. One of ordinary skill in the art will recognize that "at least part of the precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from room temperature to approximately 600° C. When a plasma deposition process is utilized, the deposition temperature may range from room temperature to approximately 500° C., preferably between room temperature and about 200° C., more preferably between room temperature and about 100° C. Alternatively, when a thermal process is performed, the deposition temperature may range from room temperature to approximately 600° C., preferably between room temperature and about 500° C., more preferably between room temperature and about 200° C., even more preferably between room temperature and about 100° C.

ALD conditions within the chamber allow the disclosed film-forming composition adsorbed or chemisorbed on the substrate surface to react and form a film on the substrate. In some embodiments, Applicants believe that plasma-treating the co-reactant may provide the co-reactant with the energy needed to react with the disclosed film-forming composition. When the co-reactant in this exemplary ALD process is treated with a plasma, the exemplary ALD process becomes an exemplary PEALD process. The co-reactant may be treated with plasma prior subsequent to introduction into the chamber.

The film-forming composition and co-reactants may be introduced into the reactor sequentially (ALD). The reactor may be purged with an inert gas between the introduction of each of the film-forming composition, any additional precursors, and the co-reactants. Another example is to introduce the co-reactant continuously and to introduce the film-forming composition by pulse, while activating the co-reactant sequentially with a plasma, provided that the film-forming composition and the non-activated co-reactant do not substantially react at the chamber temperature and pressure conditions (CW PEALD).

Each pulse of the disclosed film-forming composition may last for a time period ranging from about 0.01 seconds to about 120 seconds, alternatively from about 1 seconds to about 80 seconds, alternatively from about 5 seconds to about 30 seconds. The co-reactant may also be pulsed into the reactor, In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized film-forming compositions and co-reactants may be simultaneously sprayed from different sectors of a shower head (without mixing of the composition and the reactant) under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 2 to 100 nm, depending on the specific deposition process. The deposition process may also be performed as many times as necessary to obtain the desired film.

The disclosed film-forming compositions and co-reactants may be introduced into the reactor either simultaneously (CVD), sequentially (ALD) or different combinations thereof. The reactor may be purged with an inert gas (for example, $N_2$, Ar, Kr, Xe) between the introduction of the film-forming composition and the introduction of the co-reactant. Alternatively, the co-reactant and the film-forming composition may be mixed together to form a co-reactant/compound mixture, and then introduced to the reactor in a mixture form. Another example is to introduce the co-reactant continuously and to introduce the disclosed film-forming composition by pulse (pulsed CVD).

For the deposition of ITO and ZTO films, the disclosed tin-containing precursors may be used in combination with indium and zinc precursors along with one or several oxygen-containing reactant gases such as but not limited to $O_2$, $O_3$, $H_2O$, $H_2O_2$, NO, $NO_2$, and $N_2O$. Common indium and zinc precursors have the general formulas $InR_3$ and $ZnR_2$, respectively, where $R=C_1-C_4$ alkyl groups may be used. In order to form ITO and ZTO films, it is however preferable to utilize tin-containing precursors disclosed herein with non-pyrophoric indium and zinc precursors. Suitable Zn precursors include but are not limited to diether and diamine adducts of dialkyl zinc precursors with compositions of $ZnR^1_2[R^2O(CH_2)_xOR^3]$, $ZnR^1_2[R^2O(CHR^4)(CH_2)OR^3]$, $ZnR^1_2[R^2O(CHR^4)(CH_2)_2OR^3]$, $ZnR^1_2[R^2O(CH_2)(CHR^4)(CH_2)OR^3]$, and $ZnR^5_2[(R^6R^7)_2N(CH_2)_xN(R^8R^9)_2]$, $ZnR^5_2[(R^6R^7)_2N(CHR^{10})(CH_2)N(R^8R^9)_2]$, $ZnR^5_2[(R^6R^7)_2N(CHR^{10})(CH_2)_2N(R^8R^9)_2]$, and $ZnR^5_2[(R^6R^7)_2N(CH_2)(CHR^{10})(CH_2)N(R^8R^9)_2]$ wherein $R^1$-$R^{10}$ are independently selected from $C_1$-$C_4$ alkyl groups. As for In precursors, one class of compounds include dialkyl amidinato indium(III) complexes having a formula of $(R^1)_2In[R^2N(R^3)CNR^5]$, where $R^1$-$R^5$ are independently selected from $C_1$-$C_4$ linear or branched alkyl groups, may be employed. Another class of In precursors is non-pyrophoric cyclopentadienyl indium derivatives, particularly those of monocyclopentadienyl indium(I) compounds with the formula (RCp)In where R=H or a $C_1$-$C_{10}$ linear or branched alkyl chain, may also be considered.

It is found that limited tin content when forming tin-containing films, specifically when forming ITO, may be finely controlled through an adequate ALD sequence, so as to optimize optical and electrical properties. For example, an indium to zinc precursor sequence of 3:1, 9:1 and 19:1 lead to tin contests of approximately 5%, 2% and 1%, respectively.

In a non-limiting exemplary ALD process of forming a tin-containing film, the vapor phase of the disclosed film-forming composition, such as, $(Me_3Sn)_2N(nPr)$, is introduced into the reaction chamber, where it is contacted with a suitable substrate. Excess composition may then be removed from the reaction chamber by purging and/or evacuating the reaction chamber, that is, either by purging a reaction chamber with an inert gas (for example, $N_2$, Ar, Kr, Xe), or passing the substrate in a sector under high vacuum and/or a carrier gas curtain. A co-reactant (for example, $O_3$) is introduced into the reaction chamber where it reacts with the absorbed film-forming composition in a self-limiting manner. Any excess co-reactant is removed from the reaction chamber by purging and/or evacuating the reaction chamber. If the desired deposited film is an oxide, such as $SnO_2$, this two-step process providing the desired film thickness may be repeated until a film having the necessary thickness has been obtained. By alternating the provision of the tin film-forming composition and co-reactant, a film of desired composition and thickness can be deposited.

Alternatively, if the desired deposited film contains tin and a second element, the two-step process above may be followed by introduction of the vapor of an additional precursor compound into the reaction chamber (three-step process). The additional precursor compound will be selected based on the nature of the film being deposited. The second elements may include Zn, In, Ga, N, S, P, As, Sb, B, Ta, Hf, Nb, Mg, Al, Sr, Y, Ba, Ca, Bi, Pb, Co, one or more lanthanides, or mixtures thereof. When an additional precursor compound is utilized, the resultant film deposited on the substrate contains tin in combination with an additional element. When the additional precursor and the tin-containing precursor are used in more than one ALD super cycle sequences, a nanolaminate film is obtained. After introduction into the reaction chamber, the additional precursor compound is contacted or adsorbed with the substrate. Afterward, any excess additional precursor compound is removed from the reaction chamber by purging and/or evacuating the reaction chamber. Once again, a co-reactant may be introduced into the reaction chamber to react with the tin-containing precursor compound. Excess co-reactant is removed from the reaction chamber by purging and/or evacuating the reaction chamber. If a desired film thickness has been achieved, the process may be terminated. However, if a thicker film is desired, the entire three-step process may be repeated. By alternating the provision of the tin film-forming composition, additional precursor compound, and co-reactant, a film of desired composition and thickness can be deposited. If the additional precursor is an indium precursor, such as, then ITO is formed. If the additional precursor is a zinc precursor, such as, then ZTO is formed.

The tin-containing films resulting from the processes discussed above may include tin oxide ($SnO_2$), InSnO (ITO), ZnSnO (ZTO), SnN, SnP, SnAs, SnSb, $Sn_2S_3$. One of ordinary skill in the art will recognize that by appropriate selection of the film-forming composition and co-reactants, the desired film composition may be obtained. The tin-containing films may provide suitable step coverage for capacitor electrodes in DRAM, the gate metal in 3D flash memory devices, the heating element in phase change memory, the electromigration barrier layer, gate metal, and contact layers in logic devices.

Upon obtaining a desired film thickness, the film may be subject to further processing, such as thermal annealing, furnace-annealing, rapid thermal annealing, UV e-beam curing, and/or plasma gas exposure. Those skilled in the art recognize the systems and methods utilized to perform these additional processing steps. For example, the $SnO_2$ film may be exposed to a temperature ranging from approximately 200° C. and approximately 1000° C. for a time ranging from approximately 0.1 second to approximately 7200 seconds under an inert atmosphere or an O-containing atmosphere, combinations thereof. Most preferably, the temperature is 400° C. for 3600 seconds under an inert atmosphere or an 0-containing atmosphere. The resulting film may contain fewer impurities and therefore may have an improved density resulting in improved leakage current. The annealing step may be performed in the same reaction chamber in which the deposition process is performed, or performed in a separate apparatus. Any of the above post-treatment methods, but especially thermal annealing, has been found effective to reduce carbon and nitrogen contamination of the $SnO_2$ film. This in turn tends to improve the resistivity of the film.

After annealing, the tin-containing films deposited by any of the disclosed processes may have a bulk resistivity at room temperature of approximately 50 μohm·cm to approximately 1,000 μohm·cm. Room temperature is approximately 20° C. to approximately 28° C. depending on the season. Bulk resistivity is also known as volume resistivity. One of ordinary skill in the art will recognize that the bulk resistivity is measured at room temperature on the films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Example 1: Synthesis of $(Me_3Sn)_2NEt$

In a three-necked 1 L three-neck round bottom flask equipped with a reflux condenser and a 200 mL additional funnel, 2.0 M THF solution of $EtNH_2$ (100 mL, 200 mmol) and 300 mL of hexane was added, and the mixture was cooled to −78° C. The additional funnel was loaded with 1.59 M nBuLi in hexane (126 mL, 200 mmol) that was then added dropwise to the $EtNH_2$ solution across 45 min during which a white precipitate formed. After stirring for 30 min, the cooling bath was removed and the mixture was stirred at room temperature for another 1 h. All volatiles were removed under vacuum, the flask was filled with 300 mL of hexane, and the corresponding suspension was cooled down to −78° C. In a separate three-necked 500 mL round bottom flask, a solution of $Me_3SnCl$ (39.46 g, 198 mmol) dissolved in 300 mL of $Et_2O$ was prepared in the glove box. This $Me_3SnCl/Et_2O$ solution was transferred via cannula to the EtNHLi suspension slowly across 45 min, and the resulting mixture was stirred for 15 min at −78° C. After removing the cooling bath, the mixture was warmed up to ambient temperature and further stirred for another 15 min. The white suspension was subsequently refluxed at 70° C. for 2 h. The reaction mixture was cooled down to ambient temperature and all solids were filtered off under $N_2$ atmosphere over Celite to afford a pale yellow solution. Most volatiles were removed in vacuo at 5 kPa and the residue was transferred to a 100 mL two-neck flask which was then equipped with a fractional distillation apparatus. The impurities were removed at 25-75° C. at 2 kPa and $(Me_3Sn)_2NEt$ (21.88 g, 59 mmol) was isolated as a colorless oil in 59% yield at 90-110° C. at 0.1 kPa. $^1H$ NMR ($C_6D_6$, 400 MHz): δ 3.29 (q, 2H, $^2J_{H\text{—}Sn}$=33.8 Hz, $^3J_{H\text{—}H}$=6.9 Hz, N—$CH_2$), 1.05 (t; 3H, $^3J_{H\text{—}H}$=6.9 Hz, N—$CH_2$—$CH_3$), 0.18 (s; 18H, $^2J_{H\text{—}Sn}$=51.8 Hz for $^{117}Sn$, $^2J_{H\text{—}Sn}$=54.3 Hz for $^{119}Sn$). $^{13}C\{^1H\}$ NMR ($C_6D_6$, 100 MHz): δ 47.4 (N—$CH_2$), 25.9 (N—$CH_2$—$CH_3$), −4.4 (Sn—$CH_3$, $^1J_{C\text{—}Sn}$=354.0 Hz for $^{117}Sn$, $^1J_{C\text{—}Sn}$=370.5 Hz for $^{119}Sn$). $^{119}Sn$ NMR ($C_6D_6$, 149 MHz): δ 74.4.

Thermogravimetry (TG) and differential thermal analysis (DTA) measurements, shown in FIG. 1, was carried out under the following measurement conditions: sample weight: 24.007 mg, atmosphere: $N_2$ at 1 atm, and rate of temperature increase: 10.0° C./min.>99% of the compound mass had evaporated at 171° C. (Residue<1%), T (50%) =134° C.

Example 2: Synthesis of $(Me_3Sn)_2N(nPr)$

In a three-necked 1 L round bottom flask equipped with a reflux condenser and a 200 mL additional funnel, $nPrNH_2$ (19.74 g, ~27.5 mL, 334 mmol) and 300 mL of hexane were added, and the mixture was cooled to −78° C. The additional funnel was loaded with 1.59 M nBuLi in hexane (200 mL, 318 mmol) which was then added dropwise to the $nPrNH_2$ solution across 30 min during which a white precipitate formed. After stirring for 30 min, the cooling bath was removed and the mixture was stirred at ambient temperature for another 30 min. All volatiles were removed under vacuum, the flask was filled with 400 mL of hexane, and the nPrNHLi suspension was cooled down to −78° C. In a separate three-necked 500 mL round bottom flask, a solution of $Me_3SnCl$ (63.37 g, 318 mmol) dissolved in 400 mL of $Et_2O$ was prepared in the glove box. This $Me_3SnCl/Et_2O$ solution was added slowly to the nPrNHLi suspension across 30 min using a cannula. After stirring for 1 h at −78° C., the cooling bath was removed and the mixture was warmed up to ambient temperature. The white suspension was subsequently refluxed at 75° C. for 2 h. After cooling down to ambient temperature, all solids were filtered off under $N_2$ atmosphere over Celite to afford a pale yellow solution. Most volatiles were removed in vacuo at 5 kPa and the residue was transferred to a 200 mL two-neck flask which was then equipped with a distillation apparatus. The impurities were removed at 50° C. at 0.1 kPa and $(Me_3Sn)_2N(nPr)$ (49.80 g, 129 mmol) was isolated as a colorless oil in 82% yield at 100-130° C. at 0.1 kPa. $^1H$ NMR ($C_6D_6$, 400 MHz): δ 3.23 (dt; 2H, $^3J_{H-Sn}$=32.7 Hz for $^{117}Sn$, $^3J_{H-Sn}$=34.1 Hz for $^{119}Sn$, $^3J_{H-H}$=3.1 Hz, $^4J_{H-H}$=1.5 Hz, N—$CH_2$), 1.39 (pseudo tq; 2H, $^3J_{H-H}$=3.1 Hz, N—$CH_2$—$CH_2$), 0.88 (t; 3H, $^3J_{H-H}$=7.3 Hz, $CH_2$—$CH_3$), 0.19 (s; 18H, $^2J_{H-Sn}$=52.1 Hz for $^{117}Sn$, $^2J_{H-Sn}$=54.3 Hz for $^{119}Sn$). $^{13}C\{^1H\}$ NMR ($C_6D_6$, 100 MHz): δ 55.4 (N—$CH_2$), 32.9 (N—$CH_2$—$CH_2$), 11.7 ($CH_2$—$CH_3$), −4.4 (Sn—$CH_3$, $^1J_{C-Sn}$=354.4 Hz for $^{117}Sn$, $^1J_{C-Sn}$=371.1 Hz for $^{119}Sn$). $^{119}Sn$ NMR ($C_6D_6$, 149 MHz): δ 75.5.

Figure 2:
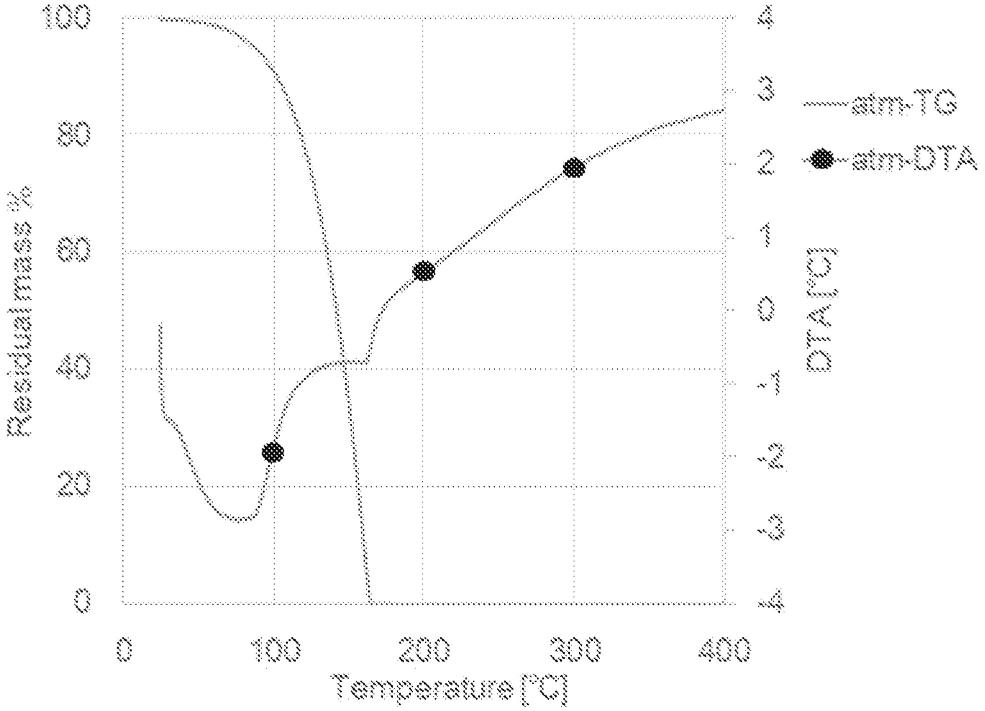
FIG. 2 shows TG and DTA profiles of $(Me_3Sn)_2N(nPr)$.

TG and DTA measurements, shown in FIG. 2, was carried out under the following measurement conditions: sample weight: 20.173 mg, atmosphere: $N_2$ at 1 atm, and rate of temperature increase: 10.0° C./min.>99% of the compound mass had evaporated at 165° C. (Residue<1%), T (50%)= 142° C.

Example 3: Synthesis of $(Me_3Sn)_2N(nBu)$

In a three-necked 500 mL round bottom flask equipped with a reflux condenser and a 100 mL additional funnel, $nBuNH_2$ (7.24 g, ~9.9 mL, 100 mmol) and 200 mL of hexane were added, and the mixture was cooled to −78° C. The additional funnel was loaded with 1.57 M nBuLi in hexane (63.9 mL, 100 mmol) which was then added dropwise to the $nBuNH_2$ solution across 30 min during which a white precipitate formed. After stirring for 30 min, the cooling bath was removed and the mixture was stirred at ambient temperature for another 30 min. All volatiles were removed under vacuum, the flask was filled with 200 mL of hexane, and the nBuNHLi suspension was once again cooled down to −78° C. In a separate two-necked 200 mL round bottom flask, a solution of $Me_3SnCl$ (19.98 g, 100 mmol) dissolved in 100 mL of $Et_2O$ was prepared in the glove box. This $Me_3SnCl/Et_2O$ solution was added slowly to the nBuNHLi suspension across 20 min using a cannula. After stirring for 1 h at −78° C., the cooling bath was removed and the mixture was warmed up to ambient temperature. The white suspension was subsequently refluxed at 75° C. for 2 h. After cooling down to ambient temperature, all solids were filtered off under $N_2$ atmosphere over Celite to afford a pale yellow solution. Most volatiles were removed in vacuo at 5 kPa and the residue was transferred to a 100 mL two-neck flask which was then equipped with a distillation apparatus. The impurities were removed at 50° C. at 0.1 kPa and $(Me_3Sn)_2N(nBu)$ (15.76 g, 39.5 mmol) was isolated as a colorless oil in 79% yield at 100-130° C. at 0.1 kPa. $^1H$ NMR ($C_6D_6$, 400 MHz): δ 3.28 (t; 2H, $^3J_{H-Sn}$=33.3 Hz for $^{117}Sn$, $^3J_{H-Sn}$=34.1 Hz for $^{119}Sn$, $^3J_{H-H}$=7.2 Hz), 1.40 (m; 2H, N—$CH_2$—$CH_2$), 1.33 (m; 2H, N—$CH_2$—$CH_2$—$CH_2$), 0.93 (t; 3H, $^3J_{H-H}$=7.2 Hz, $CH_2$—$CH_3$), 0.21 (s; 18H, $^2J_{H-Sn}$=53.2 Hz for $^{117}Sn$, $^2J_{H-Sn}$=54.3 Hz for $^{119}Sn$). $^{13}C\{^1H\}$ NMR ($C_6D_6$, 100 MHz): δ 52.9 (N—$CH_2$), 42.4 (N—$CH_2$—$CH_2$), 20.8 (N—$CH_2$—$CH_2$—$CH_2$), 15.2 ($CH_2$—$CH_3$), −4.3 (Sn—$CH_3$, $^1J_{C-Sn}$=354.1 Hz for $^{117}Sn$, $^1J_{C-Sn}$=370.8 Hz for $^{119}Sn$). $^{119}Sn$ NMR ($C_6D_6$, 149 MHz): δ 75.4.

Figure 3:
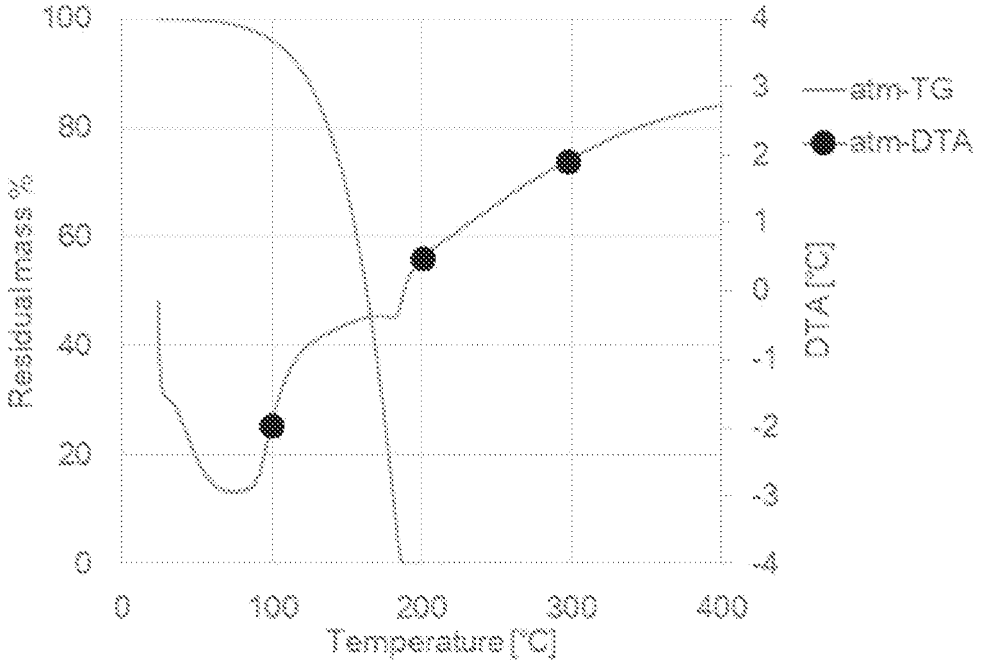
FIG. 3 shows TG and DTA profiles of $(Me_3Sn)_2N(nBu)$.

TG and DTA measurements, shown in FIG. 3, was carried out under the following measurement conditions: sample weight: 18.389 mg, atmosphere: $N_2$ at 1 atm, and rate of temperature increase: 10.0° C./min.>99% of the compound mass had evaporated at 189° C. (Residue<1%), T (50%)= 164° C.

Example 4: Synthesis of $(Me_3Sn)_2N(CH_2CF_3)$

In the glove box, a 100 mL J. Young tube was charged with $Me_3SnNEt_2$ (25.06 g, 106.2 mmol) and $CF_3CH_2NH_2$ (5.25 g, 53.0 mmol) at ambient temperature. After stirring for 2 h, the reaction progress was monitored by NMR spectroscopy. If $Me_3SnNEt_2$ still remained, an appropriate amount of $CF_3CH_2NH_2$ was further added to the reaction mixture. The resulting colorless reaction mixture was then stirred overnight. The reaction setup was removed from the glove box and subsequently equipped with a fractional distillation apparatus. After removing the volatile byproducts at 2 kPa at 50-75° C., pure $(Me_3Sn)_2N(CH_2CF_3)$ (15.38 g, 36.2 mmol) was collected at 0.1 kPa at 90-110° C. as a colorless oil in 68% yield. $^1H$ NMR ($C_6D_6$, 400 MHz): δ 3.53 (q; 2H, $^3J_{H-F}$=9.5 Hz, $^3J_{H-Sn}$=31.7 Hz for $^{117}Sn$, $^3J_{H-Sn}$=33.0 Hz for $^{119}Sn$, N—$CH_2$), 0.15 (s; 18H, $^2J_{H-Sn}$=54.7 Hz, Sn—$CH_3$). $^{13}C\{^1H\}$ NMR ($C_6D_6$, 100 MHz): N—$CH_2$ signals merged with reference signals, 53.6 (q; $^2J_{C-F}$=30.5 Hz, $^2J_{C-Sn}$=10.1 Hz, N—$CH_2$), −4.4 (Sn—$CH_3$, $^1J_{C-Sn}$=362.7 Hz for $^{117}Sn$, $^1J_{C-Sn}$=380.0 Hz for $^{119}Sn$). $^{13}C\{^1H\}$ NMR (ppm, $CDCl_3$): 127.1 (q; $^1J_{C-F}$=281.3 Hz, $CH_2$—$CF_3$), 52.8 (q; $^2J_{C-F}$=30.7 Hz, $^2J_{C-Sn}$=11.0 Hz, N—$CH_2$), −4.8 (Sn—$CH_3$, $^1J_{C-Sn}$=362.7 Hz for $^{117}Sn$, $^1J_{C-Sn}$=380.0 Hz for $^{119}Sn$). $^{19}F$ NMR ($C_6D_6$, 376 MHz): −74.9 (t; $^3J_{F-H}$=9.5 Hz). $^{119}Sn$ NMR ($C_6D_6$, 149 MHz): 94.6.

Figure 4:
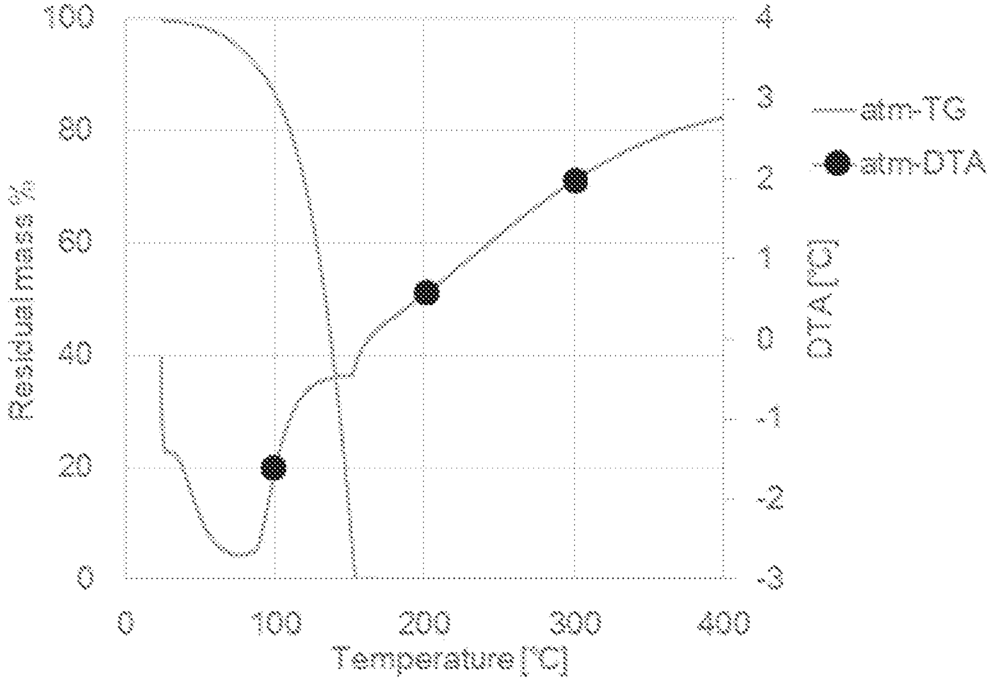
FIG. 4 shows TG and DTA profiles of $(Me_3Sn)_2N(CH_2CF_3)$.

TG and DTA measurements, shown in FIG. 4, was carried out under the following measurement conditions: sample weight: 19.728 mg, atmosphere: $N_2$ at 1 atm, and rate of temperature increase: 10.0° C./min.>99% of the compound mass had evaporated at 156° C. (Residue<1%), T (50%)=134° C.

Example 5: CVD of $SnO_x$ Film Using "$(Me_3Sn)_2N$(nPr)+$O_3$" at 50° C.

Deposition of $SnO_x$ films were done by CVD using $(Me_3Sn)_2N$(nPr) and $O_3$ as tin source and oxygen source, respectively, under the experimental conditions shown below:

Reaction chamber temperature: 50° C.
Reaction chamber pressure: 1 torr
Carrier gas $N_2$ flow rate: 350 sccm
Precursor canister temperature: room temperature
Precursor canister pressure: 40 torr
$N_2$ bubbling of precursor: 40 sccm
Precursor flow rate: approximately 0.26 sccm
$O_3$ flow rate: 100 sccm (concentration>200 g/m$^3$)
Deposition duration time: 30 min Based on the thickness measurements done by ellipsometer, the results of film on Si substrates are estimated as follows:

Thickness: 28 nm
Growth rate: 0.94 nm/min
Refractive index: 1.92

Based on X-ray photoelectron spectroscopy (XPS) analysis, the film composition data are estimated as follows: Sn: 43.1%, O: 40.5%, C: 12%, N: 1.7 at 50° C.

Example 6: CVD of $SnO_x$ Film Using "$(Me_3Sn)_2N$(nPr)+$O_3$" at 100° C.

Deposition of $SnO_x$ films were done by CVD using $(Me_3Sn)_2N$(nPr) and $O_3$ as tin source and oxygen source, respectively, under the experimental conditions shown below:

Reaction chamber temperature: 100° C.
Reaction chamber pressure: 1 torr
Carrier gas $N_2$ flow rate: 350 sccm
Precursor canister temperature: RT
Precursor canister pressure: 40 torr
$N_2$ bubbling of precursor: 40 sccm
Precursor flow rate: approximately 0.26 sccm
$O_3$ flow rate: 100 sccm (concentration>200 g/m$^3$)
Deposition duration time: 30 min Based on the thickness measurements done by ellipsometer, the results of the film on Si substrates are estimated as follows:

Thickness: 14 nm
Growth rate: 0.46 nm/min
Refractive index: 1.92

Based on the XPS analysis, the film composition data are estimated as follows: Sn: 41.2%, O: 46.6%, C: 6.6%, N: 1.2 at 100° C.

Example 7: CVD of $SnO_x$ Film Using "$(Me_3Sn)_2N$(nPr)+$O_3$" at 200° C.

Deposition of $SnO_x$ films were done by CVD using $(Me_3Sn)_2N$(nPr) and $O_3$ as tin source and oxygen source, respectively, under the experimental conditions shown below:

Reaction chamber temperature: 200° C.
Reaction chamber pressure: 1 torr
Carrier gas $N_2$: 350 sccm
Precursor canister temperature: room temperature
Precursor canister pressure: 40 torr
$N_2$ bubbling of precursor: 40 sccm
Precursor flow rate: approximately 0.26 sccm
$O_3$ flow rate: 100 sccm (concentration>200 g/m$^3$)
Deposition duration time: 30 min Based on the thickness measurements done by ellipsometer, the results of the film on Si substrates are estimated as follows:

Thickness: 12 nm
Growth rate: 0.41 nm/min
Refractive index: 1.92

Based on the XPS analysis, the film composition data are estimated as follows: Sn: 42.9%, O: 57.1%, C: <DL, N: <DL at 200° C.

Example 8: CVD of $SnO_x$ Film Using "$(Me_3Sn)_2N$(nPr)+$O_3$" at 300° C.

Deposition of $SnO_x$ films were done by CVD using $(Me_3Sn)_2N$(nPr) and $O_3$ as tin source and oxygen source, respectively, under the experimental conditions shown below:

Reaction chamber temperature: 300° C.
Reaction chamber pressure: 1 torr
Carrier gas $N_2$: 350 sccm
Precursor canister temperature: room temperature
Precursor canister pressure: 40 torr
$N_2$ bubbling of precursor: 40 sccm
Precursor flow rate: approximately 0.26 sccm
$O_3$ flow rate: 100 sccm (concentration>200 g/m$^3$)
Duration time: 30 min Based on the thickness measurements done by ellipsometer, the results of the film on Si substrates are estimated as follows:

Thickness: 28 nm
Growth rate: 0.94 nm/min
Refractive index: 1.92

Based on the XPS analysis, the film composition data are estimated as follows: Sn: 41.7%, O: 58.3%, C: <DL, N: <DL at 300° C.

Example 9: CVD of $SnO_x$ Film Using "$(Me_3Sn)_2N$(nPr)+$O_3$" at 400° C.

Deposition of $SnO_x$ films were done by CVD using $(Me_3Sn)_2N$(nPr) and $O_3$ as tin source and oxygen source, respectively, under the experimental conditions shown below:

Reaction chamber temperature: 400° C.
Reaction chamber pressure: 1 torr
Carrier gas $N_2$: 350 sccm
Precursor canister temperature: room temperature
Precursor canister pressure: 40 torr
$N_2$ bubbling of precursor: 40 sccm
Precursor flow rate: approximately 0.26 sccm
$O_3$ flow rate: 100 sccm (concentration>200 g/m$^3$)
Deposition duration time: 30 min Based on the thickness measurements done by ellipsometer, the results of the film on Si substrates are estimated as follows:

Thickness: 28 nm
Growth rate: 0.94 nm/min
Refractive index: 1.92

Based on the XPS analysis, the film composition data are estimated as follows: Sn: 38.7%, O: 54.3%, C: 3.6, N: 0.9 at 400° C.

Example 10: ALD (P=1 Torr) of $SnO_x$ Films Using "$(Me_3Sn)_2N(nPr)+O_3$" at 300° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 300° C.
Reaction chamber pressure: 1 torr
Canister temperature: 26° C.
Canister pressure: 40 torr
$N_2$ bubble flow rate: 40 sccm
$N_2$ carrier flow rate: 350 sccm
Number of cycles: 300
Pulse sequence:
  $(Me_3Sn)_2N(nPr)$ (1 sccm): 5 s
  $N_2$ flow (purge): 5 s
  $O_3$ (100 sccm): 5 s
  $N_2$ flow (purge): 5 s Based on the thickness measurements done by ellipsometer, the results of the film on Si substrates are estimated as follows:

Substrate: Si (pretreated with HF)
Thickness average: 3.0 nm
Growth-per-cycle: 0.10 Å/cycle
Refractive index: 1.82

Based on the atomic ratio profile estimated by XPS, the $SnO_x$ film formed by this method was composed of Sn:O ratio of 1:4 with C and N contamination of <DL and ~6%, respectively.

Example 11: ALD (P=1 Torr) of $SnO_x$ Films Using "$(Me_3Sn)_2N(nPr)+O_3$" at 400° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 400° C.
Reaction chamber pressure: 1 torr
Canister temperature: 26° C.
Canister pressure: 40 torr
$N_2$ bubble flow rate: 40 sccm
$N_2$ carrier flow rate: 350 sccm
Number of cycles: 300
Pulse sequence:
  $(Me_3Sn)_2N(nPr)$ (1 sccm): 5 s
  $N_2$ flow (purge): 5 s
  $O_3$ (100 sccm): 5 s
  $N_2$ flow (purge): 5 s Based on the thickness measurements done by ellipsometer, the results of the film on Si substrates are estimated as follows:

Substrate: Si (pretreated with HF)
Thickness average: 5.4 nm
Growth-per-cycle: 0.18 Å/cycle
Refractive index: 1.91

Based on the atomic ratio profile estimated by XPS, the $SnO_x$ film formed by this method was composed of Sn:O ratio of 1:1.7 with C and N contamination of <DL and <3%, respectively.

Example 12: ALD (P=1 Torr) of $SnO_x$ Films Using "$(Me_3Sn)_2N(nPr)+O_3$" at 500° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 500° C.
Reaction chamber pressure: 1 torr
Canister temperature: 26° C.
Canister pressure: 40 torr
$N_2$ bubble flow rate: 40 sccm
$N_2$ carrier flow rate: 350 sccm
Number of cycles: 300
Pulse sequence:
  $(Me_3Sn)_2N(nPr)$ (1 sccm): 5 s
  $N_2$ flow (purge): 5 s
  $O_3$ (100 sccm): 5 s
  $N_2$ flow (purge): 5 s Based on the thickness measurements done by ellipsometer, the results of the film on Si substrates are estimated as follows:

Substrate: Si (pretreated with HF)
Thickness average: 6.9 nm
Growth-per-cycle: 0.23 Å/cycle
Refractive index: 1.92

Based on the atomic ratio profile estimated by XPS, the $SnO_x$ film formed by this method was composed of Sn:O ratio of 1:1.6 with C and N contamination of <DL and <2%, respectively.

Example 13: High Pressure ALD (P=100 Torr) of $SnO_x$ Films Using "$(Me_3Sn)_2N(nPr)+O_3$" at 80° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 80° C.
Reaction chamber pressure: 100 torr
Canister temperature: 52° C.
Canister pressure: 130 torr
$N_2$ bubble flow rate: 130 sccm
$N_2$ carrier flow rate: 350 sccm
Number of cycles: 300
Pulse sequence:
  $(Me_3Sn)_2N(nPr)$ (4 sccm): 10 s
  $N_2$ flow (purge): 60 s
  $O_3$ (100 sccm): 30 s
  $N_2$ flow (purge): 60 s Based on the thickness measurements done by ellipsometer, the results of the film on Si substrates are estimated as follows:

Substrate: Si (pretreated with HF)
Thickness average: 13.9 nm
Growth-per-cycle: 0.49 Å/cycle
Refractive index: 1.87

Based on the atomic ratio profile estimated by XPS, the $SnO_x$ film formed by this method was composed of Sn:O ratio of 1:1.89.

Example 14: High Pressure ALD (P=200 Torr) of $SnO_x$ Films Using "$(Me_3Sn)_2N(nPr)+O_3$" at 80° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 80° C.
Reaction chamber pressure: 200 torr
Canister temperature: 52° C.
Canister pressure: 230 torr
$N_2$ bubble flow rate: 230 sccm
$N_2$ carrier flow rate: 700 sccm Number of cycles: 300
Pulse sequence:
$(Me_3Sn)_2N(nPr)$ (4 sccm): 10 s
$N_2$ flow (purge): 60 s
$O_3$ (100 sccm): 30 s
$N_2$ flow (purge): 60 s Based on the thickness measurements done by ellipsometer, the results of the film on Si substrates are estimated as follows:

Substrate: Si (pretreated with HF)
Thickness average: 15.1 nm
Growth-per-cycle: 0.50 Å/cycle
Refractive index: 1.87

Based on the atomic ratio profile estimated by XPS, the $SnO_x$ film formed by this method was composed of Sn:O ratio of 1:1.9.

Example 15: High Pressure ALD (P=350 Torr) of $SnO_x$ Films Using "$(Me_3Sn)_2N(nPr)+O_3$" at 80° C.

Depositions of $SnO_x$ films were done on a tubular reaction chamber by alternative pulses of $(Me_3Sn)_2N(nPr)$ and $O_3$, separated by purge time between two pulses, in the following experimental conditions:

Reaction chamber temperature: 80° C.
Reaction chamber pressure: 350 torr
Canister temperature: 52° C.
Canister pressure: 400 torr
$N_2$ bubble flow rate: 400 sccm
$N_2$ carrier flow rate: 1225 sccm
Number of cycles: 300
Pulse sequence:
$(Me_3Sn)_2N(nPr)$ (4 sccm): 10 s
$N_2$ flow (purge): 60 s
$O_3$ (100 sccm): 30 s
$N_2$ flow (purge): 60 s Based on the thickness measurements done by ellipsometer, the results of the film on Si substrates are estimated as follows:

Substrate: Si (pretreated with HF)
Thickness average: 8.7 nm
Growth-per-cycle: 0.29 Å/cycle
Refractive index: 1.78

Based on the atomic ratio profile estimated by XPS, the $SnO_x$ film formed by this method was composed of Sn:O ratio of 1:1.83.

Example 16: PEALD of $SnO_x$ Film Using "$(Me_3Sn)_2N(nPr)+O_2$ Plasma" at 80° C.

Depositions of $SnO_x$ films were done on a Beneq tool by alternative pulses of $(Me_3Sn)_2N(nPr)$ and $O_2$ direct plasma, separated by purge time between two pulses, in the following experimental conditions:

Reaction chamber temperature: 80° C.
Canister temperature: 52° C.
Reaction chamber pressure: 1.0 mbar
$(Me_3Sn)_2N(nPr)$ pulse pressure: 10.0 mbar
$N_2$ carrier flow rate 300 sccm
Number of cycles: 200
Pulse sequence:
$(Me_3Sn)_2N(nPr)$: 1 s
$N_2$ flow (purge): 4 s
$O_2$ plasma: 4 s
$N_2$ flow (purge): 4 s
Plasma setting:
Type: Direct Plasma
$O_2$ flow rate: 100 sccm
Ar flow rate: 100 sccm
RF Power: 200 W Based on the thickness measurements done by the ellipsometer, the results of the film on Si substrates are estimated as follows:

Thickness_aver: 22.6 nm
Growth rate: 1.13 Å/cycle
Std. Non uniformity (N.U): 1.2%
Refractive index: 1.99

Alternatively, adding $H_2O$ pulse between the precursor $(Me_3Sn)_2N(nPr)$ pulse and $O_2$ direct plasma pulse, separated by purge time between each two pulses, no deposited film observed in the following experimental conditions:

Reaction chamber temperature: 80° C.
Canister temperature: 52° C.
Reaction chamber pressure: 1.0 mbar
$(Me_3Sn)_2N(nPr)$ pulse pressure: 10.0 mbar
$H_2O$ pulse pressure: 11.0 mbar
$O_2$ pulse pressure: 20.0 mbar
$O_2$ flow rate: 540 sccm
$N_2$ carrier flow rate 300 sccm
Number of cycles: 200
Pulse sequence:
$(Me_3Sn)_2N(nPr)$: 1 s
$N_2$ flow (purge): 4 s
$H_2O$: 2 s
$N_2$ flow (purge): 2 s
$O_2$: 2 s
$N_2$ flow (purge): 2 s Based on the thickness measurements done by the ellipsometer, there was no deposited film observed.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a tin-containing film on a substrate, the method comprising:

exposing the substrate to a vapor or a liquid of a film-forming composition that comprises a tin-containing precursor having the general formula:

$$(R_3Sn)_2NR'$$

wherein R and R' each are independently H, a $C_1$ to $C_6$ linear, a $C_3$ to $C_6$ branched or cyclic alkyl group, or a $C_1$ to $C_4$ linear, a $C_3$ to $C_4$ branched or cyclic saturated hydrofluorocarbon group, provided that R'≠Et, iPr or i-Bu; and depositing at least part of the tin-containing precursor onto the substrate to form the tin-containing film using a chemical deposition method.

2. The method of claim 1, wherein the chemical deposition method includes ALD, CVD, MLD, SOD, SOC, mist coating, dip coating, slit coating, spray coating, which may or may not be assisted by heating, light, direct or remote plasma, or combination thereof.

3. The method of claim 1, wherein a deposition temperature for the chemical deposition method is approximately 100° C. or lower.

4. The method of claim 1, wherein a deposition temperature for the chemical deposition method is approximately 80° C. or lower.

5. The method of claim 1, wherein the tin-containing precursors are liquid at ambient temperature.

6. The method of claim 1, wherein the tin-containing precursors are volatile at a temperature of approximately 100° C. or lower.

7. The method of claim 1, wherein the tin precursor is $(Me_3Sn)_2N(nPr)$.

8. The method of claim 1, wherein the tin precursor is $(Me_3Sn)_2N(nBu)$.

9. The method of claim 1, wherein the tin precursor is $(Me_3Sn)_2N(CH_2CF_3)$.

10. The method of claim 1, further comprising exposing the substrate to a co-reactant including an oxidizing agent selected from $O_2$, $O_3$, $H_2O$, $H_2O_2$, NO, $N_2O$, $NO_2$, O radicals, alcohol, silanols, aminoalcohols, carboxylic acids, para-formaldehyde, or mixtures thereof, or a nitrogen-containing reducing agent selected from $NH_3$, $N_2$, $H_2$, $N_2/H_2$, $H_2$ and $NH_3$, $N_2$ and $NH_3$, $NH_3$ and $N_2H_4$, NO, $N_2O$, amines, diamines, cyanides, di-imines, hydrazines, organic amines, pyrazoline, pyridine, primary amines such as methylamine, ethylamine, tertbutylamine; secondary amines selected from dimethylamine, diethylamine, di-isopropylamine, ethylmethylamine, pyrrolidine; tertiary amines such as trimethylamine, triethylamine, trisilylamine, or mixture thereof.

11. The method of claim 10, wherein the co-reactant is $O_3$, $O_2$, $H_2O_2$ or $H_2O$.

12. The method of claim 1, wherein the tin-containing film is $SnO_2$, InSnO (ITO), ZnSnO (ZTO), SnN, SnP, SnAs, SnSb or $Sn_2S_3$.

13. The method of claim 1, wherein the tin-containing film contains a second element selected from Zn, In, Ga, N, S, P, As, Sb, B, Ta, Hf, Nb, Mg, Al, Sr, Y, Ba, Ca, Bi, Pb, Co, one or more lanthanides, or mixtures thereof.

14. The method of claim 1, wherein the substrate is a powder that comprises one or more of NMC (Lithium Nickel Manganese Cobalt Oxide), LCO (Lithium Cobalt Oxide), LFP (Lithium Iron Phosphate), and other battery cathode materials.

15. A film-forming composition for a vapor deposition process comprising a tin-containing precursor having the general formula:

$$(R_3Sn)_2NR'$$

wherein R and R' each are independently H, a $C_1$ to $C_6$ linear, a $C_3$ to $C_6$ branched or cyclic alkyl group, or a $C_1$ to $C_4$ linear, a $C_3$ to $C_4$ branched or cyclic saturated hydrofluorocarbon group, provided that R'≠Et, iPr or i-Bu.

16. The film-forming composition of claim 15, wherein the tin-containing precursor is selected from the group consisting of $(Me_3Sn)_2NEt$, $(Me_3Sn)_2N(nPr)$, $(Me_3Sn)_2N(nBu)$ and $(Me_3Sn)_2N(CH_2CF_3)$.

17. The film-forming composition of claim 15, wherein a purity of the tin-containing precursor is great than 99%.

18. The film-forming composition of claim 15, wherein the tin-containing precursor is liquid at ambient temperature and volatile at a temperature of approximately 100° C. or lower.

* * * * *